United States Patent
Ashworth

(10) Patent No.: US 12,191,972 B2
(45) Date of Patent: Jan. 7, 2025

(54) MULTIBAND REPEATER ARCHITECTURE

(71) Applicant: Wilson Electronics, LLC, St. George, UT (US)

(72) Inventor: Christopher Ken Ashworth, Toquerville, UT (US)

(73) Assignee: Wilson Electronics, LLC, St. George, UT (US)

( * ) Notice: Subject to any disclaimer, the term of this patent is extended or adjusted under 35 U.S.C. 154(b) by 1027 days.

(21) Appl. No.: 16/987,230

(22) Filed: Aug. 6, 2020

(65) Prior Publication Data
US 2022/0045741 A1    Feb. 10, 2022

(51) Int. Cl.
| | |
|---|---|
| *H03F 3/68* | (2006.01) |
| *H03F 1/48* | (2006.01) |
| *H04B 1/50* | (2006.01) |
| *H04B 3/36* | (2006.01) |
| *H04B 7/155* | (2006.01) |
| *H04W 16/28* | (2009.01) |

(52) U.S. Cl.
CPC .............. *H04B 7/155* (2013.01); *H03F 1/48* (2013.01); *H04B 1/50* (2013.01); *H04B 3/36* (2013.01); *H04W 16/28* (2013.01)

(58) Field of Classification Search
CPC . H04B 7/155; H04B 1/50; H04B 3/36; H04B 1/0057; H04B 1/0475; H04B 7/14; H04B 2001/0416; H04B 7/15535; H03F 1/48; H03F 2200/111; H03F 2200/294; H03F 2200/451; H03F 3/19; H03F 3/245; H03F 3/68; H03F 3/211; H03F 3/602; H03F 3/195; H03F 1/0288; H04W 16/28

USPC .................................... 330/286, 124 R, 295
See application file for complete search history.

(56) References Cited

U.S. PATENT DOCUMENTS

| | | | |
|---|---|---|---|
| 4,776,032 A | 10/1988 | Odate et al. | |
| 5,303,395 A | 4/1994 | Dayani | |
| 5,737,687 A | 4/1998 | Martin et al. | |
| 5,777,530 A | 7/1998 | Nakatuka | |
| 5,835,848 A | 11/1998 | Bi et al. | |
| 6,005,884 A | 12/1999 | Cook et al. | |

(Continued)

FOREIGN PATENT DOCUMENTS

EP      1525678 B1    7/2008

OTHER PUBLICATIONS

3GPP2 C.S0011-B; "Recommended Minimum Performance Standards for cdma2000® Spread Spectrum Mobile Stations"; TIA-98-E; (Dec. 13, 2002); 448 pages; Release B, V1.0, Revision E.

(Continued)

*Primary Examiner* — Khanh V Nguyen
(74) *Attorney, Agent, or Firm* — Thorpe North & Western, LLP.

(57) ABSTRACT

A technology is described for a repeater. A repeater can comprise: a server port; a donor port; a first uplink (UL) amplification and filtering path coupled between the server port and the donor port, wherein the UL amplification and filtering path is configured to pass a UL signal of a first band and a UL signal of a second band through a first bandpass filter; a first downlink (DL) amplification and filtering path coupled between the server port and the donor port, wherein the first DL amplification and filtering path is configured to pass a DL signal of the first band and a DL signal of a third band through a second bandpass filter.

21 Claims, 17 Drawing Sheets

(56) References Cited

U.S. PATENT DOCUMENTS

| | | | |
|---|---|---|---|
| 6,711,388 | B1 | 3/2004 | Neitiniemi |
| 6,889,033 | B2 | 5/2005 | Bongfeldt |
| 6,990,313 | B1 | 1/2006 | Yarkosky |
| 7,035,587 | B1 | 4/2006 | Yarkosky |
| 7,221,967 | B2 | 5/2007 | Van Buren et al. |
| 7,974,573 | B2 | 7/2011 | Dean |
| 8,027,699 | B2 * | 9/2011 | Zhen .................. H03F 1/0277 375/276 |
| 8,867,572 | B1 * | 10/2014 | Zhan .................. H04W 16/26 370/497 |
| 10,432,294 | B2 * | 10/2019 | Ashworth .......... H04B 7/15507 |
| 2002/0044594 | A1 | 4/2002 | Bongfeldt |
| 2003/0123401 | A1 | 7/2003 | Dean |
| 2004/0137854 | A1 | 7/2004 | Ge |
| 2004/0146013 | A1 | 7/2004 | Song et al. |
| 2004/0166802 | A1 | 8/2004 | McKay, Sr. et al. |
| 2004/0219876 | A1 | 11/2004 | Baker et al. |
| 2004/0235417 | A1 | 11/2004 | Dean |
| 2005/0118949 | A1 | 6/2005 | Allen et al. |
| 2006/0084379 | A1 | 4/2006 | O'Neill |
| 2007/0071128 | A1 | 3/2007 | Meir et al. |
| 2007/0188235 | A1 | 8/2007 | Dean |
| 2008/0081555 | A1 | 4/2008 | Kong et al. |
| 2008/0096483 | A1 | 4/2008 | Van Buren et al. |
| 2008/0278237 | A1 | 11/2008 | Blin |
| 2011/0151775 | A1 | 6/2011 | Kang et al. |

OTHER PUBLICATIONS

ADL5513; "1 MHz to 4 GHz, 80 dB Logarithmic Detector/Controller"; Data Sheet; (2008); 12 pages; Analog Devices, Inc.

HMC713LP3E; "54 dB, Logarithmic Detector / Controller, 50-8000 MHz"; Data Sheet; (2010); 12 pages.

HMC909LP4E; "RMS Power Detector Single-Ended, DC-5.8 GHz"; Data Sheet; (2010); 21 pages.

PIC16F873; "28/40-Pin 8-Bit CMOS FLASH Microcontrollers"; (2001); Data Sheet; 218 pages.

\* cited by examiner

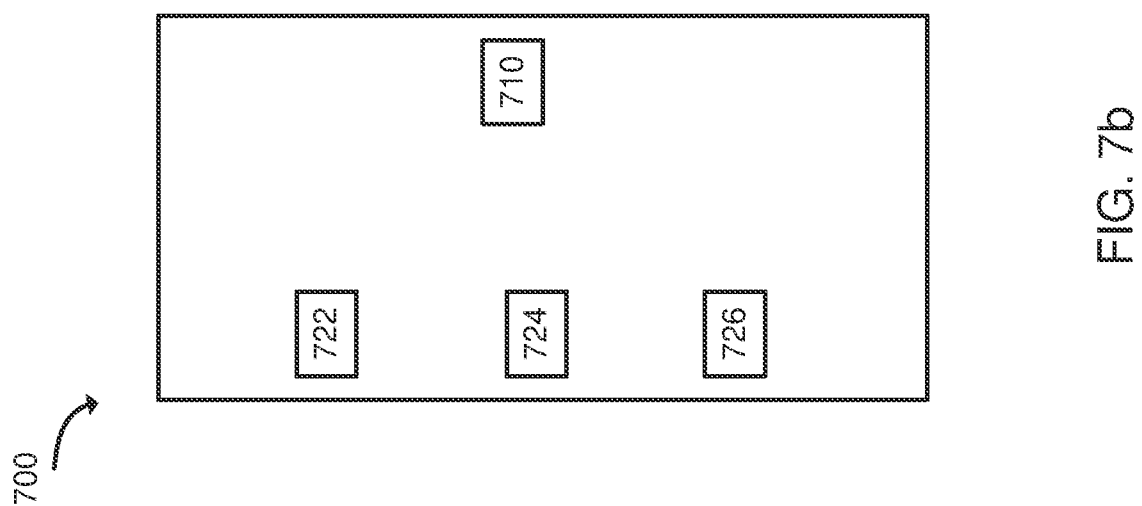

MULTIBAND REPEATER ARCHITECTURE

BACKGROUND

Repeaters can be used to increase the quality of wireless communication between a wireless device and a wireless communication access point, such as a cell tower. Repeaters can improve the quality of the wireless communication by amplifying, filtering, and/or applying other processing techniques to uplink and downlink signals communicated between the wireless device and the wireless communication access point.

As an example, the repeater can receive, via an antenna, downlink signals from the wireless communication access point. The repeater can amplify the downlink signal and then provide an amplified downlink signal to the wireless device. In other words, the repeater can act as a relay between the wireless device and the wireless communication access point. As a result, the wireless device can receive a stronger signal from the wireless communication access point. Similarly, uplink signals from the wireless device (e.g., telephone calls and other data) can be received at the repeater. The repeater can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 7b illustrates a multiplexer in accordance with an example;

Figure 1:
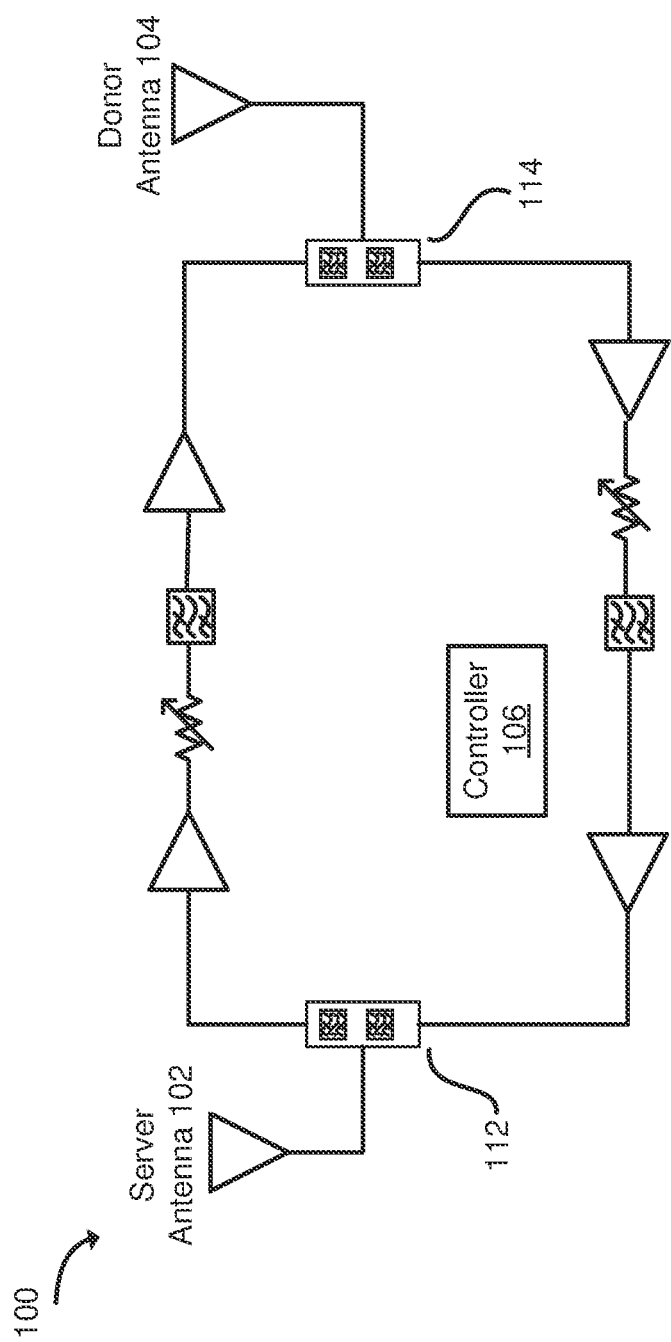
FIG. 1 illustrates a repeater in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Figure 3A:
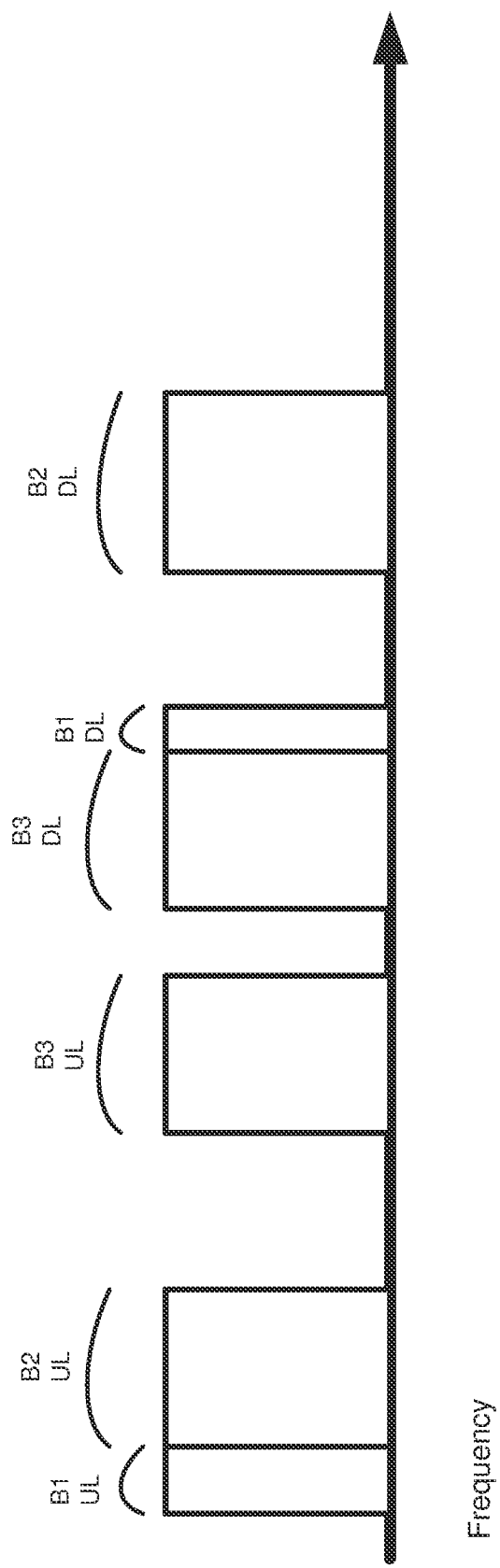
FIG. 3a illustrates frequency bands in accordance with an example.

Contiguous frequency bands can present a problem for repeater architectures and network protection. As illustrated in FIG. 3a, band 1 (B1), band 2 (B2), and band 3 (B3) can each have an uplink (UL) band and a downlink (DL) band. B1 UL can have a frequency range contiguous with the frequency range of B2 UL. B1 DL can have a frequency range contiguous with the frequency range of B3 DL.

Contiguous frequency bands can be difficult to filter, amplify, and transmit between base stations and wireless devices using separate band pass filters for each frequency band. To simplify the repeater architecture, a single filter can be configured to pass the contiguous UL frequency bands, B1 UL and B2 UL, and a separate single filter can be configured to pass the contiguous DL frequency bands, B1 DL and B3 DL. Using one filter for the contiguous UL frequency bands and one filter for the contiguous DL frequency bands can reduce the complexity of the repeater and decrease the cost of the components.

However, this repeater architecture can also present challenges for network protection. Detecting the power level from downlink bands (B1 DL and B3 DL) may not provide adequate information to provide network protection for the uplink bands (B1 UL and B2 UL) because the power level of B2 DL would not be included. Detecting the power level from all three downlink bands (B1 DL, B2 DL, and B3 DL) can be used to provide network protection for the uplink bands (B1 UL and B2 UL). The maximum power level of the uplink bands (B1 UL and B2 UL) can be based on the combined received power levels of all three downlink bands (B1 DL, B2 DL, and B3 DL).

In an example, as illustrated in FIG. 1, a bi-directional repeater system can comprise a repeater 100 connected to an outside antenna 104 or donor antenna 104 and an inside antenna 102 or server antenna 102. The repeater 100 can include a donor antenna port that can be internally coupled to a second duplexer (or diplexer or multiplexer or circulator or splitter) 114. The repeater 100 can include a server antenna port that can also be coupled to a first duplexer (or diplexer or multiplexer or circulator or splitter) 112. Between the two duplexers, 114 and 112, can be two paths: a first path and a second path. The first path can comprise a low noise amplifier (LNA) with an input coupled to the first duplexer 112, a variable attenuator coupled to an output of the LNA, a filter coupled to the variable attenuator, and a power amplifier (PA) coupled between the filter and the second duplexer 114. The LNA can amplify a lower power signal without degrading the signal to noise ratio. The PA can adjust and amplify the power level by a desired amount. A second path can comprise an LNA with an input coupled to the second duplexer 114, a variable attenuator coupled to an output of the LNA, a filter coupled to the variable attenuator, and a PA coupled between the filter and the first duplexer 112. The first path can be a downlink amplification path or an uplink amplification path. The second path can be a downlink amplification path or an uplink amplification path. The repeater 100 can also comprise a controller 106. In one example, the controller 106 can include one or more processors and memory.

In one example, the controller 106 can be configured to perform network protection for the repeater 100. The controller 106 can perform network protection in accordance with Part 20 of the Federal Communications Commission (FCC) Consumer Booster Rules. The FCC Consumer Booster Rules necessitate that uplink signal paths and downlink signal are to work together for network protection. Network protection can be performed in order to protect a cellular network from overload or noise floor increase. The controller 106 can perform network protection by adjusting a gain or noise power for each band in the uplink transmission paths based on control information from each band in the downlink transmission paths. The control information from each band in the downlink transmission paths can include a received signal strength indication (RSSI) associated with downlink received signals. In other words, based on the RSSI of the downlink received signals traveling on the downlink transmission paths, the controller 106 can adjust (i.e., increase or decrease) the gain or noise power for the uplink transmission paths. By adjusting the gain or noise floor when performing the network protection, the controller 106 can prevent the network (e.g., base stations) from becoming overloaded with uplink signals from the repeater 100 that exceed a defined threshold.

Figure 2:
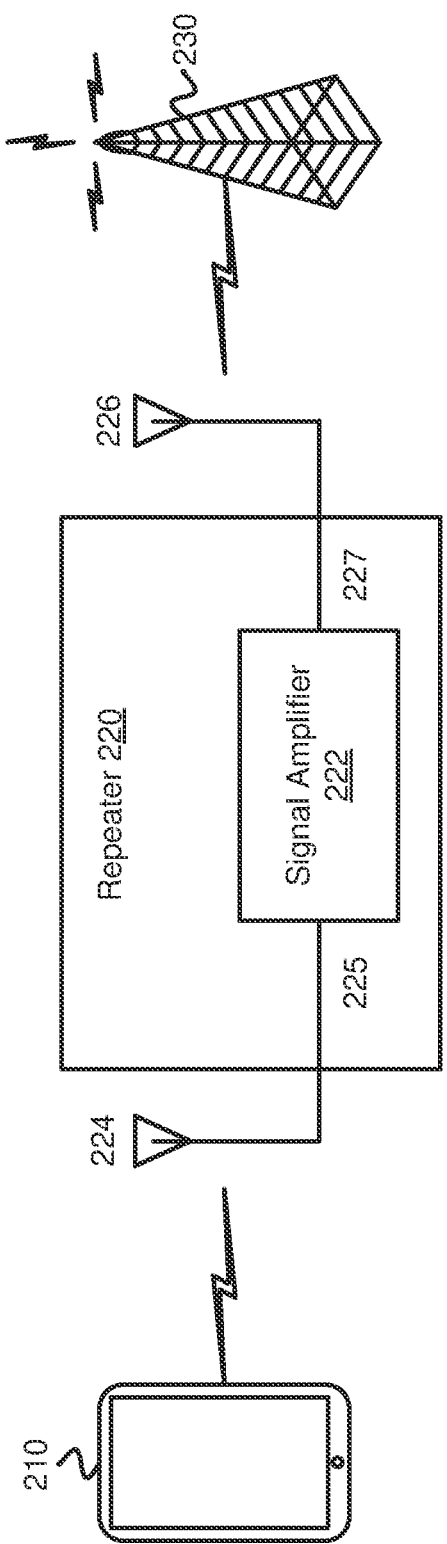
FIG. 2 illustrates a repeater in communication with a user equipment (UE) and a base station (BS) in accordance with an example.

FIG. 2 illustrates an exemplary repeater 220 in communication with a wireless device 210 and a base station 230. The repeater 220 (also referred to as a cellular signal amplifier) can improve the quality of wireless communication by amplifying, filtering, and/or applying other processing techniques via a signal amplifier 222 to uplink signals communicated from the wireless device 210 to the base station 230 and/or downlink signals communicated from the base station 230 to the wireless device 210. In other words, the repeater 220 can amplify or boost uplink signals and/or downlink signals bi-directionally. In one example, the repeater 220 can be at a fixed location, such as in a home or office. Alternatively, the repeater 220 can be attached to a mobile object, such as a vehicle or a wireless device 210. The repeater can be a signal booster, such as a cellular signal booster.

In one configuration, the repeater 220 can be configured to be connected to a device antenna 224 (e.g., an inside antenna, server antenna, or a coupling antenna) and a node antenna 226 (e.g., an outside antenna or donor antenna). The node antenna 226 can receive the downlink signal from the base station 230. The downlink signal can be provided to the signal amplifier 222 via a second coaxial cable 227 or other type of wired, wireless, optical, or radio frequency connection operable to communicate radio frequency signals. The signal amplifier 222 can include one or more radio signal amplifiers for amplification and filtering of cellular signals. The downlink signal that has been amplified and filtered can be provided to the device antenna 224 via a first coaxial cable 225 or other type of radio frequency connection operable to communicate radio frequency signals. The device antenna 224 can communicate the downlink signal that has been amplified and filtered to the wireless device 210.

Similarly, the device antenna 224 can receive an uplink signal from the wireless device 210. The uplink signal can be provided to the signal amplifier 222 via the first coaxial cable 225 or other type of wired, wireless, optical, or radio frequency connection operable to communicate radio frequency signals. The signal amplifier 222 can include one or more radio signal amplifiers for amplification and filtering of cellular signals. The uplink signal that has been amplified and filtered can be provided to the node antenna 226 via the second coaxial cable 227 or other type of wired, wireless, optical, or radio frequency connection operable to communicate radio frequency signals. The node antenna 226 can communicate the uplink signal that has been amplified and filtered to a node, such as a base station 230.

In one embodiment, the device antenna 224 and the node antenna 226 can be integrated as part of the repeater 220. Alternatively, the repeater 220 can be configured to be connected to a separate device antenna 224 or node antenna 226. The device antenna and the node antenna may be provided by a different provider than the repeater 220.

In one example, the repeater 220 can send uplink signals to a node and/or receive downlink signals from the node. While FIG. 2 shows the node as a base station 230, this is not intended to be limiting. The node can comprise a wireless wide area network (WWAN) access point (AP), a base station (BS), an evolved Node B (eNB), a next generation Node B (gNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the repeater 220 used to amplify the uplink and/or a downlink signal can be a handheld booster. The handheld booster can be implemented in a sleeve of the wireless device 210. The wireless device sleeve may be attached to the wireless device 210, but may be removed as needed. In this configuration, the repeater 220 can automatically power down or cease amplification when the wireless device 210 approaches a particular base station. In other words, the repeater 220 may determine to stop performing signal amplification when the quality of uplink and/or downlink signals is above a defined threshold based on a location of the wireless device 210 in relation to the base station 230.

In one example, the repeater 220 can include a battery to provide power to various components, such as the signal amplifier 222, the device antenna 224, and the node antenna 226. The battery can also power the wireless device 210 (e.g., phone or tablet). Alternatively, the repeater 220 can receive power from the wireless device 210.

In one configuration, the repeater 220 can be a Federal Communications Commission (FCC)-compatible consumer repeater. As a non-limiting example, the repeater 220 can be compatible with FCC Part 20 or 47 Code of Federal Regulations (C.F.R.) Part 20.21 (Mar. 21, 2013). In addition, the handheld booster can operate on the frequencies used for the provision of subscriber-based services under parts 22 (Cellular), 24 (Broadband PCS), 27 (AWS-1, 700 megahertz (MHz) Lower A-E Blocks, and 700 MHz Upper C Block), and 90 (Specialized Mobile Radio) of 47 C.F.R. The repeater 220 can be configured to automatically self-monitor its operation to ensure compliance with applicable noise and gain limits. The repeater 220 can either self-correct or shut down automatically if the repeater's operations violate the regulations defined in 47 CFR Part 20.21. While a repeater that is compatible with FCC regulations is provided as an example, it is not intended to be limiting. The repeater can be configured to be compatible with other governmental regulations based on the location where the repeater is configured to operate.

In one configuration, the repeater 220 can improve the wireless connection between the wireless device 210 and the base station 230 (e.g., cell tower) or another type of wireless wide area network (WWAN) access point (AP) by amplifying desired signals relative to a noise floor. The repeater 220 can boost signals for cellular standards, such as the Third Generation Partnership Project (3GPP) Long Term Evolution (LTE) Release 8, 9, 10, 11, 12, 13, 14, 15, or 16 standards or Institute of Electronics and Electrical Engineers (IEEE) 802.16. In one configuration, the repeater 220 can boost signals for 3GPP LTE Release 16.0.0 (January 2019) or other desired releases.

The repeater 220 can boost signals from the 3GPP Technical Specification (TS) 36.101 (Release 16 Jan. 2019) bands or LTE frequency bands. For example, the repeater 220 can boost signals from the LTE frequency bands: 2, 4, 5, 12, 13, 17, 25, and 26. In addition, the repeater 220 can boost selected frequency bands based on the country or region in which the repeater is used, including any of bands 1-85 or other bands, as disclosed in 3GPP TS 36.104 V16.0.0 (January 2019).

In another configuration, the repeater 220 can boost signals from the 3GPP Technical Specification (TS) 38.104 (Release 15 Jan. 2019) bands or 5G frequency bands. In addition, the repeater 220 can boost selected frequency bands based on the country or region in which the repeater is used, including any of bands n1-n86, n257-n261, or other bands, as disclosed in 3GPP TS 38.104 V15.4.0 (January 2019).

Figure 3B:
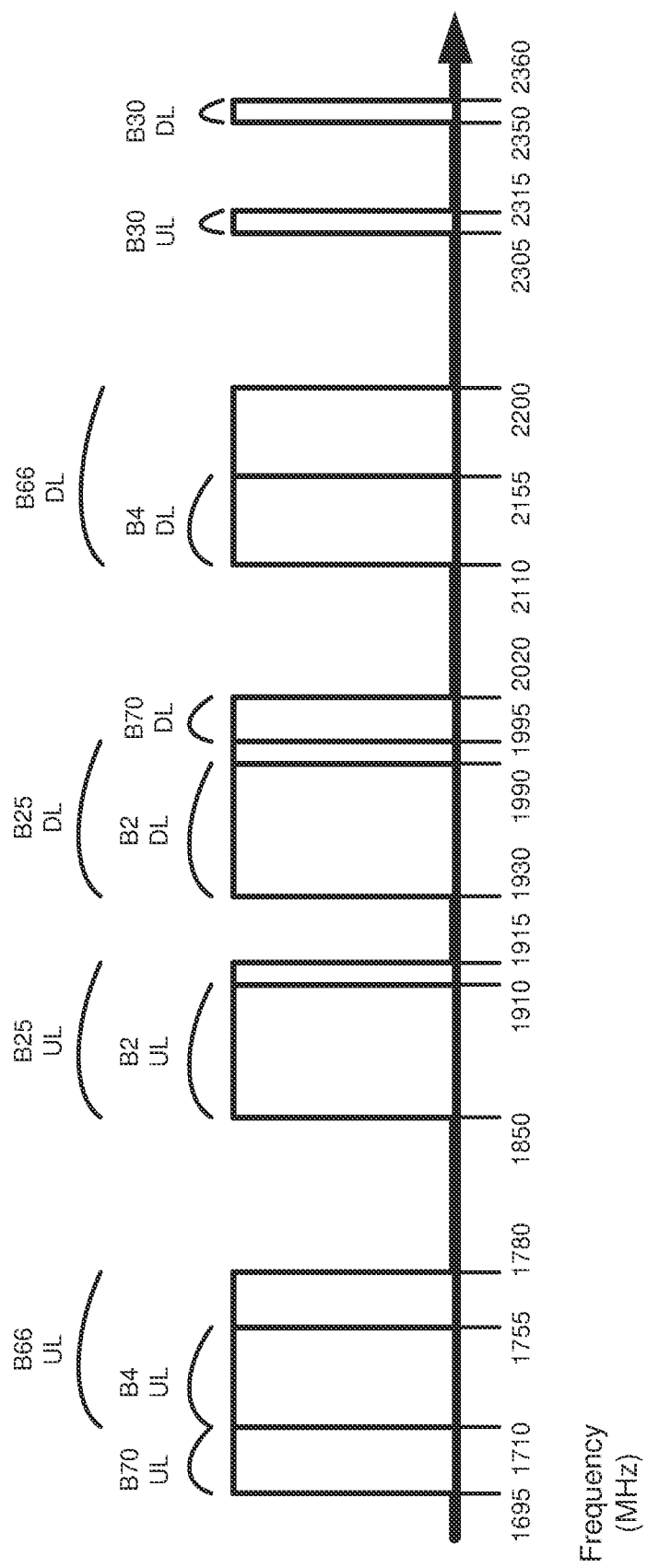
FIG. 3b illustrates Third Generation Partnership Project (3GPP) long term evolution (LTE) frequency bands in accordance with an example.

In one example, as illustrated in FIG. 3b, an uplink (UL) signal of a first band (e.g., B70 UL) can occupy a frequency range between approximately 1695 megahertz (MHZ) and approximately 1710 MHZ. An UL signal of a second band (e.g., B4 UL or B66 UL) can occupy a frequency range between approximately 1710 MHz and approximately 1780 MHz (e.g., B66 UL) or can occupy a frequency range between approximately 1710 MHz and approximately 1755 MHz (e.g., B4 UL).

In another example, a downlink (DL) signal of a first band (e.g., B70 DL) can occupy a frequency range between approximately 1995 MHz and approximately 2020 MHz. A DL signal of a third band (e.g., B2 DL or B25 DL) can occupy a frequency range between approximately 1930 MHz and approximately 1990 MHz (e.g., B2 DL) or can occupy a frequency range between approximately 1930 MHz and approximately 1995 MHZ (e.g., B25 DL).

In another example, a UL signal of a third band (e.g., B2 UL or B25 UL) can occupy a frequency range between approximately 1850 MHz and approximately 1910 MHZ (e.g., B2 UL) or can occupy a frequency range between approximately 1850 MHz and approximately 1915 MHz (e.g., B25 UL).

In another example, a DL signal of a second band (e.g., B4 DL or B66 DL) can occupy a frequency range between approximately 2110 MHz and approximately 2155 MHZ (e.g., B4 DL) or can occupy a frequency range between approximately 2110 MHz and approximately 2200 MHZ (e.g., B66 DL).

In another example, the UL signal of the second band (e.g., B66 UL) can comprise a UL subset band (e.g., B4 UL), wherein the bandwidth of the UL subset band (e.g., B4 UL with a frequency range between approximately 1710 MHz to approximately 1755 MHZ) can be less than the bandwidth of the UL signal of the second band (e.g., B66 UL with a frequency range between approximately 1710 MHz to approximately 1780 MHZ).

In another example, the DL signal of the second band (e.g., B66 DL) can comprise a DL subset band (e.g., B4 DL), wherein the bandwidth of the DL subset band (e.g., B4 DL with a frequency range between approximately 2110 MHz to approximately 2155 MHZ) can be less than the bandwidth of the DL signal of the second band (e.g., B66 DL with a frequency range between approximately 2110 MHz to approximately 2200 MHZ).

In another example, the UL signal of the third band (e.g., B25 UL) can comprise a UL subset band (e.g., B2 UL), wherein the bandwidth of the UL subset band (e.g., B2 UL with a frequency range between approximately 1850 MHz to approximately 1910 MHZ) can be less than the bandwidth of the UL signal of the third band (e.g., B25 UL with a frequency range between approximately 1850 MHz to approximately 1915 MHZ).

In another example, the DL signal of the third band (e.g., B25 DL) can comprise a DL subset band (e.g., B2 DL), wherein the bandwidth of the DL subset band (e.g., B2 DL with a frequency range between approximately 1930 MHz to approximately 1990 MHz) can be less than the bandwidth of the DL signal of the third band (e.g., B25 DL with a frequency range between approximately 1930 MHz to approximately 1995 MHz).

In another example, a bandwidth border for the UL signal of the first band (e.g., B70 UL) can be separated from a bandwidth border for the UL signal of the second band (e.g., B4 UL or B66 UL) by less than 5 MHz or by less than 10 MHz. In another example, a bandwidth border for the UL signal of the first band (e.g., B70 UL) can be contiguous with a bandwidth border for the UL signal of the second band (e.g., B4 UL or B66 UL).

In another example, a bandwidth border for the DL signal of the first band (e.g., B70 DL) can be separated from a bandwidth border for the DL signal of the third band (e.g., B2 DL or B25 DL) by less than 5 MHz or by less than 10 MHz. In another example, a bandwidth border for the DL signal of the first band (e.g., B70 DL) can be contiguous with a bandwidth border for the DL signal of the second band (e.g., B25 DL).

In another example, the first band can be 3GPP LTE band 70 with a UL frequency range between approximately 1695 MHz and approximately 1710 MHZ and a DL frequency range between approximately 1995 MHz and approximately 2020 MHz.

In another example, the second band can be 3GPP LTE band 4 with a UL frequency range between approximately 1710 MHz and approximately 1755 MHz and a DL frequency range between approximately 2110 MHz and approximately 2155 MHz.

In another example, the second band can be 3GPP LTE band 66 with a UL frequency range between approximately 1710 MHz and approximately 1780 MHZ and a DL frequency range between approximately 2110 MHz and approximately 2200 MHz.

In another example, the third band can be 3GPP LTE band 2 with a UL frequency range between approximately 1850 MHz and approximately 1910 MHZ and a DL frequency range between approximately 1930 MHz and approximately 1990 MHz.

In another example, the third band can be 3GPP LTE band 25 with a UL frequency range between approximately 1850 MHz and approximately 1915 MHZ and a DL frequency range between approximately 1930 MHz and approximately 1995 MHz.

In one example, a UL signal of a fourth band (e.g., B30 UL) can occupy a frequency range between approximately 2305 MHz and approximately 2315 MHz. A DL signal of the fourth band (e.g., B30 DL) can occupy a frequency range between approximately 2350 MHz and approximately 2360 MHz. In another example, the fourth band can be 3GPP LTE band 30.

Figure 4A:
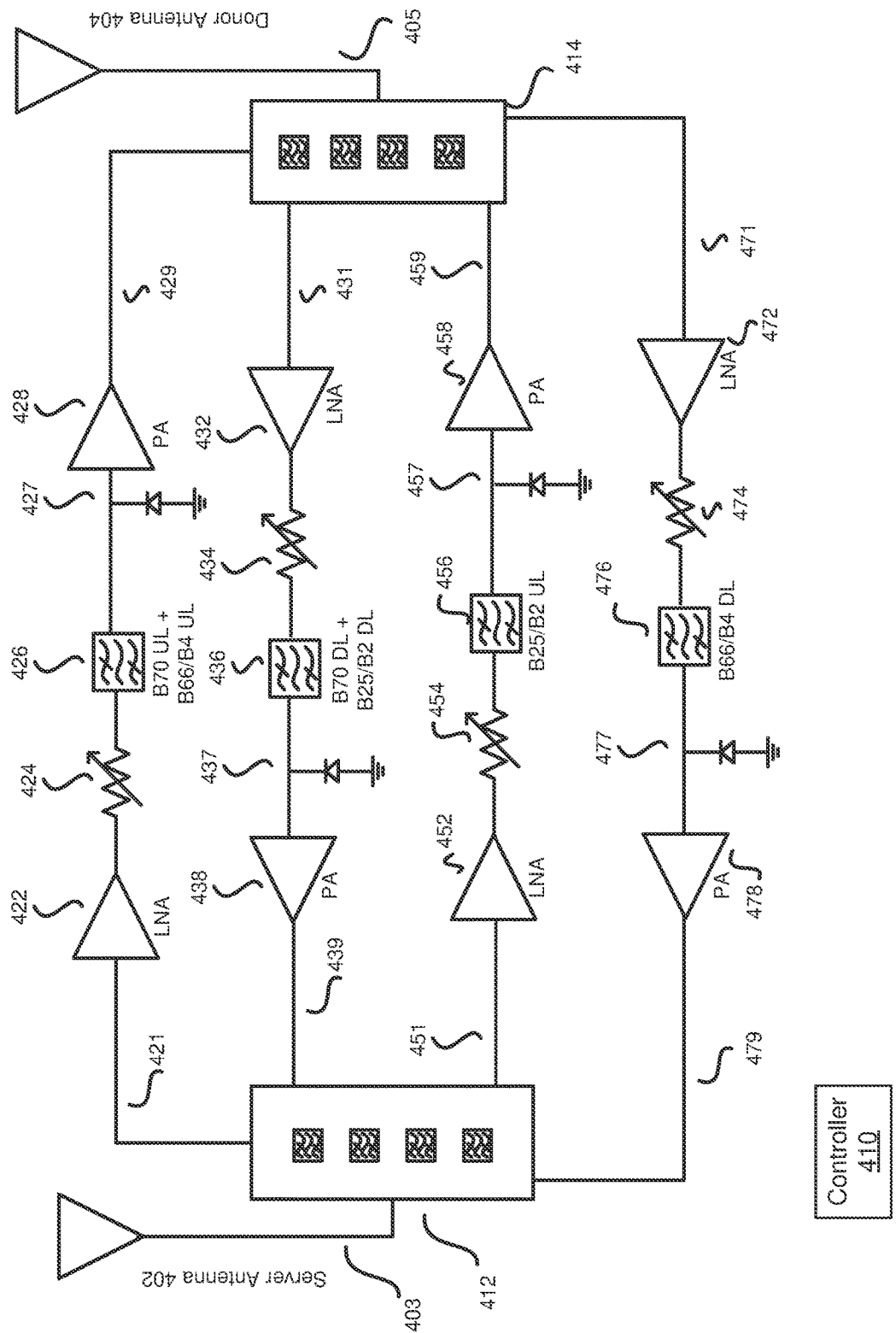
FIG. 4a illustrates a multiband repeater configured for network protection in accordance with an example.

In another example, as illustrated in FIG. 4a, a repeater can comprise a first port 403 (e.g., a server port, a device port, or an inside port) and a second port 405 (e.g., a donor port, a node port, or an outside port). The first port 403 can be configured to be coupled to a first antenna 402 (a server antenna, a device antenna, or an inside antenna). The first antenna 402 can be configured to receive a first-direction signal (e.g., an uplink signal) from a wireless device and transmit a second-direction signal (e.g., a downlink signal) to a wireless device. The second port 405 can be configured to be coupled to a second antenna 404 (a donor antenna, a node antenna, or an outside antenna). The second antenna 404 can be configured to transmit a first-direction signal (e.g., an uplink signal) to a base station (e.g., an evolved node B (eNB) or a new radio (NR) node B (gNB)) and receive a second-direction signal (e.g., a downlink signal) from a base station.

In another example, the first port 403 can be configured to be coupled to a multiplexer 412 (or one or more duplexers, one or more multiplexers, one or more circulators, or one or more splitters). The multiplexer 412 can be configured to be coupled to a first UL amplification and filtering path 421, a first DL amplification and filtering path 439, a second UL amplification and filtering path 451, and a second DL amplification and filtering path 479. A first-direction signal received at the first port 403 can be directed to the multiplexer 412. The multiplexer 412 can direct the first-direction signal, based on its frequency, to the first UL amplification and filtering path 421 or the second UL amplification and filtering path 451.

In another example, the second port 405 can be configured to be coupled to a multiplexer 414 (or one or more duplexers, one or more multiplexers, one or more circulators, or one or more splitters). The multiplexer 414 can be configured to be coupled to the first UL amplification and filtering path 429, the first DL amplification and filtering path 431, the second UL amplification and filtering path 459, and the second DL amplification and filtering path 471. A second-direction signal received at the second port 405 can be directed to the multiplexer 414.

The multiplexer 414 can direct the second-direction signal, based on its frequency, to the first DL amplification and filtering path 431 or the second DL amplification and filtering path 471.

In another example, a first-direction signal can be directed from the multiplexer 412 to the first UL amplification and filtering path 421. The first UL amplification and filtering path 421 can comprise one or more of: one or more low noise amplifiers (LNAs) 422, one or more variable attenuators 424, one or more filters 426, one or more power detectors 427, or one or more power amplifiers (PAS) 428. The one or more PAs 428 can comprise: a variable gain amplifier, a fixed-gain power amplifier, or a gain block. The one or more filters 426 can be configured to pass both a 3GPP FDD frequency band 70 UL and one or more of a 3GPP FDD frequency band 4 UL or 3GPP FDD frequency band 66 UL.

In another example, after being directed along the first-direction path, a first-direction signal can be amplified and filtered in accordance with the type of amplifiers and filters including along the first UL amplification and filtering path 421. The first-direction signal can be further directed to the multiplexer 414. The multiplexer 414 can direct the amplified and/or filtered first-direction signal to the second port 405. The first-direction signal can be directed from the second port 405 to the second antenna 404. The first-direction signal can be an uplink signal or a downlink signal.

In another example, a second-direction signal can be directed from the multiplexer 414 to the first DL amplification and filtering path 431. The first DL amplification and filtering path 431 can comprise one or more of: one or more low noise amplifiers (LNAs) 432, one or more variable attenuators 434, one or more filters 436, one or more power detectors 437, or one or more power amplifiers (PAS) 438. The one or more PAs 438 can comprise: a variable gain amplifier, a fixed-gain power amplifier, or a gain block. The one or more filters 436 can be configured to pass both a 3GPP LTE frequency band 70 DL and one or more of a 3GPP LTE frequency band 2 DL or a 3GPP LTE frequency band 25 DL.

In another example, after being directed along the first DL amplification and filtering path 431, a second-direction signal can be amplified and filtered in accordance with the type of amplifiers and filters including along the first DL amplification and filtering path 431. The second-direction signal can be further directed to the multiplexer 412. The multiplexer 412 can direct the amplified and/or filtered second-direction signal to the first port 403. The second-direction signal can be directed from the first port 403 to the first antenna 402. The second-direction signal can be a downlink signal or an uplink signal.

In another example, the multiplexer 412 can be configured to be coupled to the second UL amplification and filtering path 451. A first-direction signal received at the first port 403 can be directed to the multiplexer 412. The multiplexer 412 can direct the first-direction signal, based on its frequency, to the second UL amplification and filtering path 451. The second UL amplification and filtering path 451 can be configured to be coupled between the multiplexer 412 and the multiplexer 414.

In another example, a first-direction signal can be directed from the multiplexer 412 to the second UL amplification and filtering path 451. The second UL amplification and filtering path 451 can comprise one or more of: one or more low noise amplifiers (LNAs) 454, one or more variable attenuators 454, one or more filters 456, one or more power detectors 457, or one or more power amplifiers (PAS) 458. The one or more PAs 458 can comprise: a variable gain amplifier, a fixed-gain power amplifier, or a gain block. The one or more filters 456 can be configured to pass one or more of 3GPP FDD frequency bands 2 or 25. The first-direction can be an uplink direction.

In another example, after being directed along the first-direction path of the second UL amplification and filtering path 451, a first-direction signal can be amplified and filtered in accordance with the type of amplifiers and filters including along the second UL amplification and filtering path 451. The first-direction signal can be further directed to the multiplexer 414. The first-direction signal can be directed from the multiplexer 414 to the second port 405. The first-direction signal can be directed from the second port 405 to the second antenna 404.

In another example, the multiplexer 414 can be configured to be coupled to the second DL amplification and filtering path 471. A second-direction signal received at the second port 405 can be directed to the multiplexer 414. The multiplexer 414 can direct the second-direction signal, based on its frequency, to the second DL amplification and filtering path 471. The second DL amplification and filtering path 471 can be configured to be coupled between the multiplexer 414 and the multiplexer 412.

In another example, a second-direction signal can be directed from the multiplexer 414 to the second DL amplification and filtering path 471. The second DL amplification and filtering path 471 can comprise one or more of: one or more low noise amplifiers (LNAs) 472, one or more variable attenuators 474, one or more filters 476, one or more power detectors 477, or one or more power amplifiers (PAS) 478. The one or more PAs 478 can comprise: a variable gain amplifier, a fixed-gain power amplifier, or a gain block. The one or more filters 476 can be configured to pass one or more of a 3GPP LTE frequency band 4 DL or a 3GPP LTE frequency band 66 DL.

In another example, after being directed along the second DL amplification and filtering path 471, a second-direction signal can be amplified and filtered in accordance with the type of amplifiers and filters including along the second DL amplification and filtering path 471. The second-direction signal can be further directed to the multiplexer 412. The multiplexer 412 can direct the amplified and/or filtered second-direction signal to the first port 403. The second-direction signal can be directed from the first port 403 to the first antenna 402. The second-direction signal can be a downlink signal or an uplink signal.

In another example, the one or more power detectors 437 can be configured to detect a maximum power or a total power from a DL signal of a first band (e.g., 3GPP LTE frequency band 70 DL) or a DL signal of a third band (e.g., 3GPP LTE frequency band 2 DL or 3GPP LTE frequency band 25 DL). In another example, the one or more power detectors 477 can be configured to detect a maximum power or a total power from a DL signal of a second band (e.g., 3GPP LTE frequency band 4 DL or 3GPP LTE frequency band 66 DL). In one example, the one or more power detectors can comprise one or more broadband power detectors. The one or more power detectors can be configured to receive radio frequency (RF) signals that are tapped off from an amplification and filtering path (e.g., the first DL amplification and filtering path or the second DL amplification and filtering path). The tapped-off RF signals can comprise in-band signals that have been passed through a band pass filter. The RF signal power from the band can be converted using a diode to a direct current (DC) signal and fed to a controller 410. The one or more power detectors can comprise one or more broadband power detectors. The broadband power detectors can detect power over a broad frequency range (band). For example, a power detector can be configured to measure power in a signal over a band from 50 MHz to 8000 MHZ (8 GHZ). The broadband range over which the power detector is configured to operate can include the frequency range of the desired band that the detector is to measure. In one example, a logarithmic detector can be used. Alternatively, other types of power detectors can be used.

In another example, a controller 410 can be configured to select an allowed maximum noise power or amplified gain level of the UL signal of the first band (e.g., 3GPP LTE frequency band 70 UL) and the UL signal of the second band (e.g., 3GPP LTE frequency band 4 UL or 3GPP LTE frequency band 66 UL) based on the detected maximum power or total DL signal power level to provide network protection. By adjusting the gain or noise floor when performing the network protection, the controller 410 can prevent the network (e.g., base stations) from becoming overloaded with uplink signals from the repeater that exceed a defined threshold.

In another example, the one or more power detectors 437 can be configured to detect a power level from the DL signal of the first band (e.g., 3GPP LTE frequency band 70 DL). In one example, the one or more power detectors 437 can be one or more channelized power detectors. In another example, a controller 410 can be configured to select a power level of the UL signal of the first band (e.g., 3GPP LTE frequency band 70 UL) based on the power level from the DL signal of the first band (e.g., 3GPP LTE frequency band 70 DL) to provide network protection.

The one or more channelized power detectors can be configured to receive radio frequency (RF) signals that are tapped off from an amplification and filtering path (e.g., the first DL amplification and filtering path or the second DL amplification and filtering path). The tapped-off RF signals can comprise in-band signals that have been passed through a band pass filter and down-converted and filtered at intermediate frequency (IF) to reduce the passband to a narrowband signal or channel. In another example, the tapped-off RF signal can be digitally sampled to reduce the signal to a narrowband signal or channel. The RF signal power from the band can be converted using a detector such as a logarithmic detector. In one example, a diode can be used to convert a power level to a direct current (DC) signal. The DC signal can be fed to a controller 410. The one or more power detectors can comprise one or more broadband power detectors.

Figure 4B:
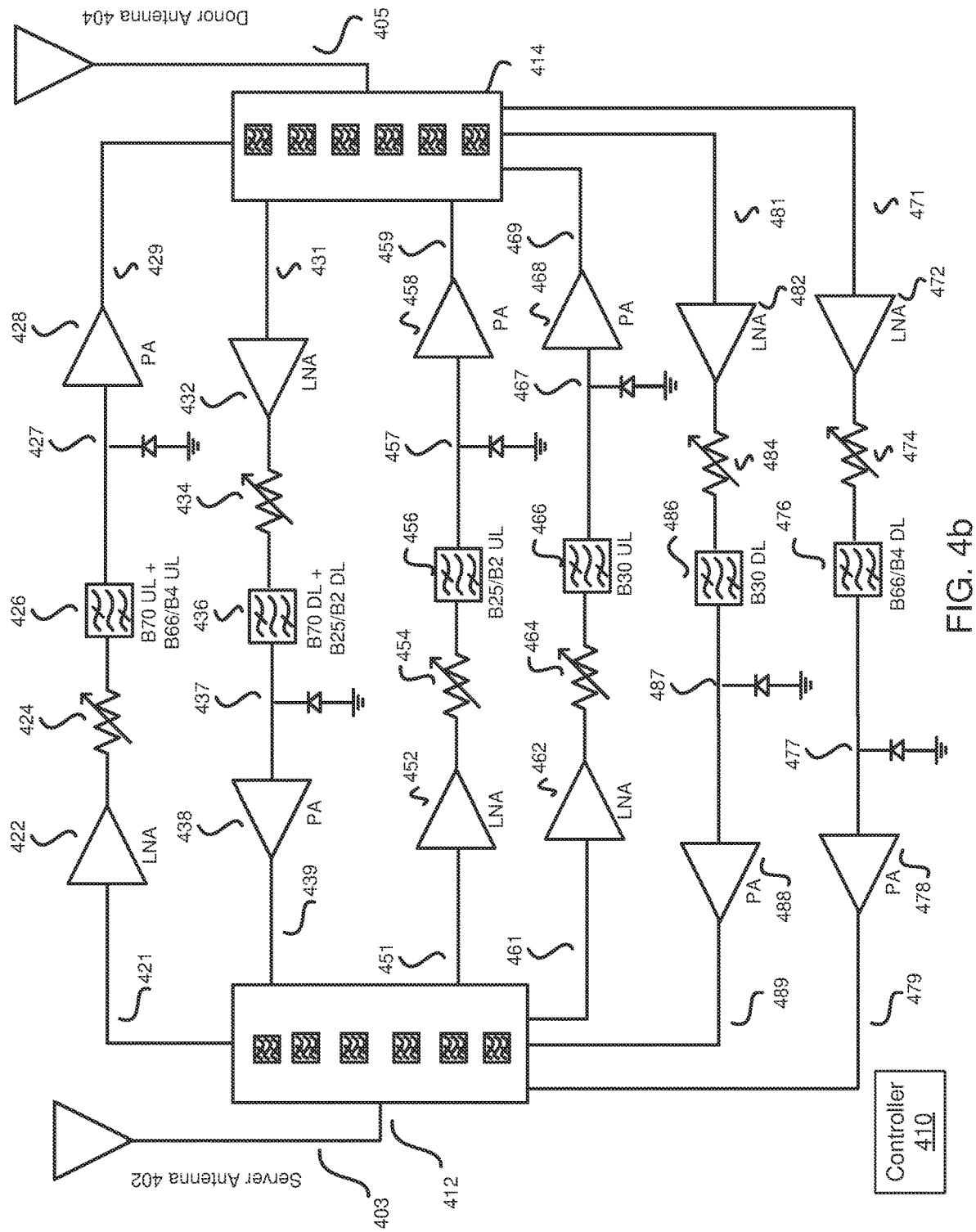
FIG. 4b illustrates a multiband repeater configured for network protection in accordance with an example.

In another example, as illustrated in FIG. 4b, a repeater can further comprise a third UL amplification and filtering path 461 and a third DL amplification and filtering path 489. In another example, a first-direction signal can be directed from the multiplexer 412 to the third UL amplification and filtering path 461. The third UL amplification and filtering path 461 can comprise one or more of: one or more low noise amplifiers (LNAs) 462, one or more variable attenuators 464, one or more filters 466, one or more power detectors 467, or one or more power amplifiers (PAS) 468. The one or more PAs 468 can comprise: a variable gain amplifier, a fixed-gain power amplifier, or a gain block. The one or more filters 466 can be configured to pass a 3GPP FDD frequency band 30 UL.

In another example, after being directed along the third UL amplification and filtering path 461, a first-direction signal can be amplified and filtered in accordance with the type of amplifiers and filters including along the third UL amplification and filtering path 461. The first-direction signal can be further directed to the multiplexer 414. The multiplexer 414 can direct the amplified and/or filtered first-direction signal to the second port 405. The first-direction signal can be directed from the second port 405 to the second antenna 404. The first-direction signal can be an uplink signal or a downlink signal.

In another example, a second-direction signal can be directed from the multiplexer 414 to the third DL amplification and filtering path 481. The third DL amplification and filtering path 481 can comprise one or more of: one or more low noise amplifiers (LNAs) 482, one or more variable attenuators 484, one or more filters 486, one or more power detectors 487, or one or more power amplifiers (PAS) 488. The one or more PAs 488 can comprise: a variable gain amplifier, a fixed-gain power amplifier, or a gain block. The one or more filters 486 can be configured to pass a 3GPP LTE frequency band 30 DL.

In another example, after being directed along the third DL amplification and filtering path 481, a second-direction signal can be amplified and filtered in accordance with the type of amplifiers and filters including along the third DL amplification and filtering path 481. The second-direction signal can be further directed to the multiplexer 412. The multiplexer 412 can direct the amplified and/or filtered second-direction signal to the first port 403. The second-direction signal can be directed from the first port 403 to the first antenna 402. The second-direction signal can be a downlink signal or an uplink signal.

Figure 5B:
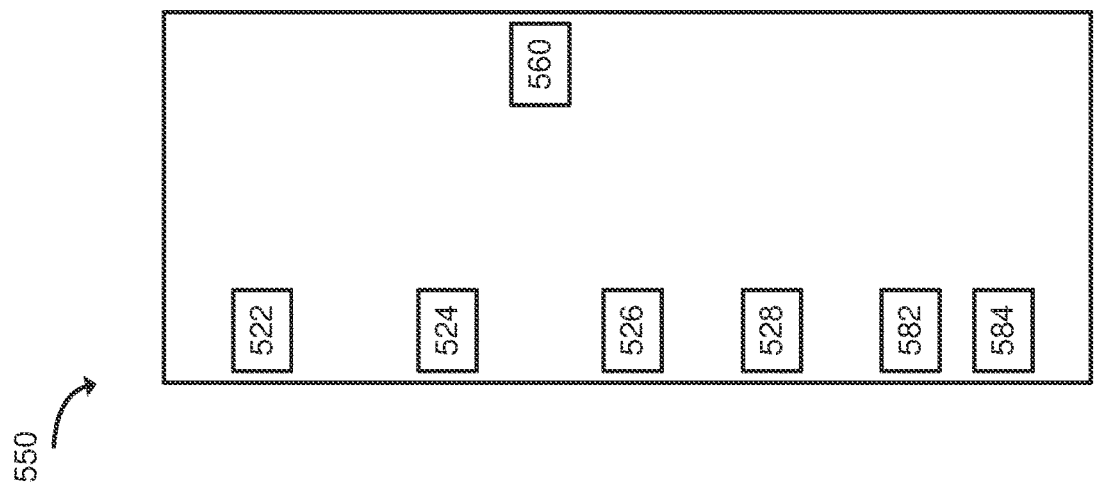
FIG. 5b illustrates a multiplexer in accordance with an example.
Figure 5A:
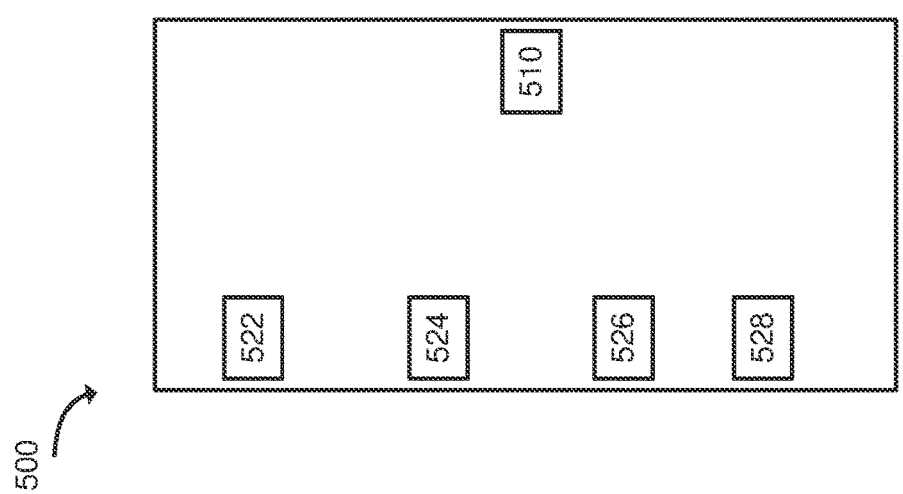
FIG. 5a illustrates a multiplexer in accordance with an example.

In another example, as illustrated in FIG. 5a, a multiplexer 500 can comprise a common port 510, a first separate port 522, a second separate port 524, a third separate port 526, and a fourth separate port 528. The common port 510 can comprise a first UL filter configured to pass a UL signal of a first band (e.g., 3GPP LTE frequency band 70 UL) and a UL signal of a second band (e.g., 3GPP LTE frequency band 4 UL or 66 UL). The common port 510 can comprise a first DL filter configured to pass a DL signal of the first band (e.g., 3GPP LTE frequency band 70 DL) and a DL signal of a third band (e.g., 3GPP LTE frequency bands 2 DL or 25 DL). The common port 510 can comprise a second UL filter configured to pass a UL signal of the third band (e.g., 3GPP LTE frequency bands 2 UL or 25 UL). The common port 510 can comprise a second DL filter configured to pass a DL signal of the second band (e.g., 3GPP LTE frequency band 4 DL or 66 DL).

In another example, the first separate port 522 can comprise a third UL filter configured to pass the UL signal of the first band (e.g., 3GPP LTE frequency band 70 UL) and the UL signal of the second band (e.g., 3GPP LTE frequency band 4 UL or 66 UL).

In another example, the second separate port 524 can comprise a third DL filter configured to pass the DL signal of the first band (e.g., 3GPP LTE frequency band 70 DL) and the DL signal of the third band (e.g., 3GPP LTE frequency bands 2 UL or 25 UL).

In another example, the third separate port 526 can comprise a fourth UL filter configured to pass the UL signal of the third band (e.g., 3GPP LTE frequency bands 2 UL or 25 UL).

In another example, the fourth separate port 528 can comprise a fourth DL filter configured to pass the DL signal of the second band (e.g., 3GPP LTE frequency bands 4 DL or 66 DL).

In another example, as illustrated in FIG. 5b, a multiplexer 550 can comprise a common port 560, a first separate port 522, a second separate port 524, a third separate port 526, a fourth separate port 528, a fifth separate port 582, and a sixth separate port 584. The common port 560 can comprise a fifth UL filter configured to pass a UL signal of a fourth band (e.g., 3GPP LTE frequency band 30 UL). The common port 560 can comprise a fifth DL filter configured to pass a DL signal of the fourth band (e.g., 3GPP LTE frequency band 30 DL).

In another example, the fifth separate port 582 can comprise a sixth UL filter configured to pass the UL signal of the fourth band (e.g., 3GPP LTE frequency band 30 UL).

In another example, the sixth separate port 584 can comprise a sixth DL filter configured to pass the DL signal of the fourth band (e.g., 3GPP LTE frequency band 30 DL).

Figure 6:
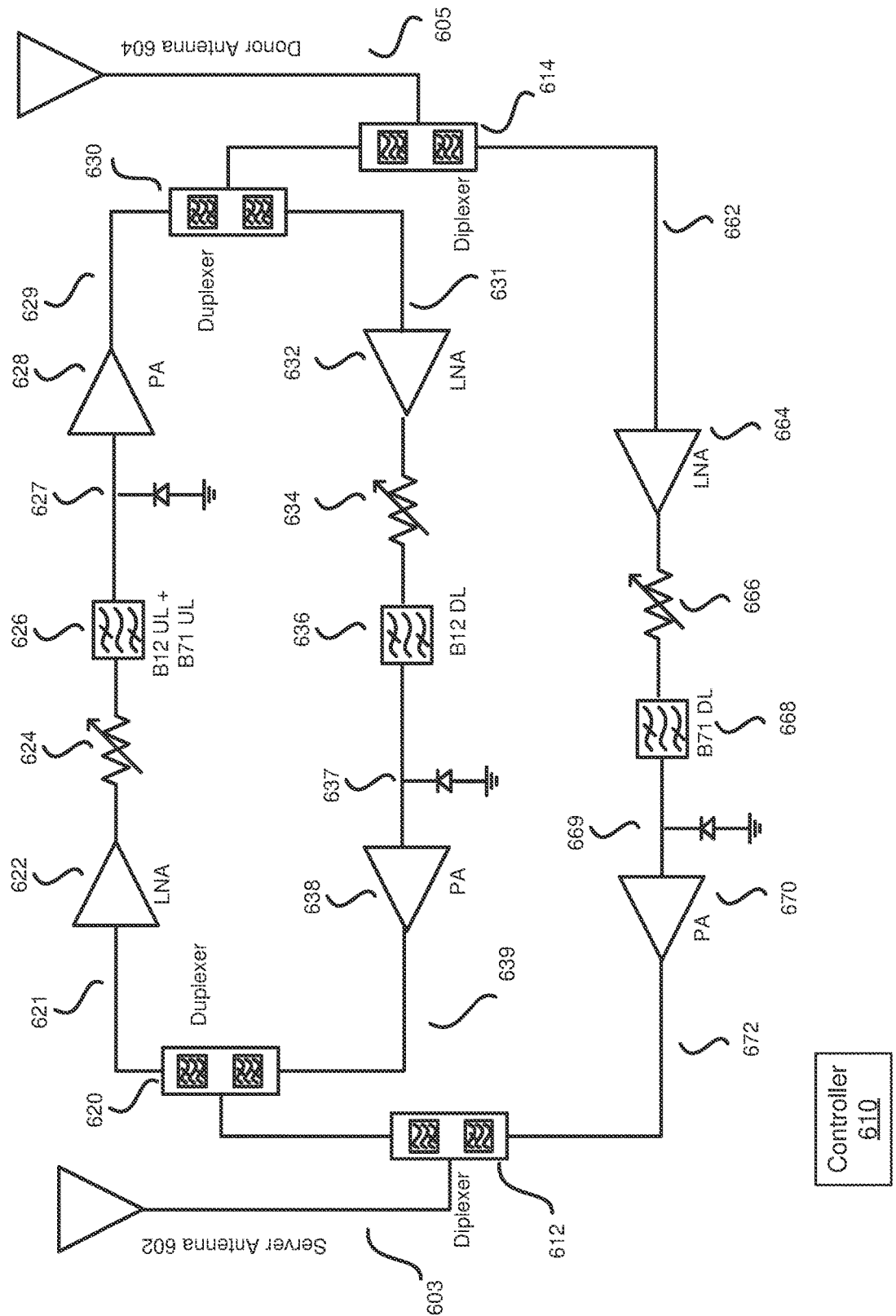
FIG. 6 illustrates a multiband repeater configured for network protection in accordance with an example.

In another example, as illustrated in FIG. 6, a repeater can comprise a first port 603 (e.g., a server port, a device port, or an inside port) and a second port 605 (e.g., a donor port, a node port, or an outside port). The first port 603 can be configured to be coupled to a first antenna 602 (a server antenna, a device antenna, or an inside antenna). The first antenna 602 can be configured to receive a first-direction signal (e.g., an uplink signal) from a wireless device and transmit a second-direction signal (e.g., a downlink signal) to a wireless device. The second port 605 can be configured to be coupled to a second antenna 604 (a donor antenna, a node antenna, or an outside antenna). The second antenna 604 can be configured to transmit a first-direction signal (e.g., an uplink signal) to a base station (e.g., an evolved node B (eNB) or a new radio (NR) node B (gNB)) and receive a second-direction signal (e.g., a downlink signal) from a base station.

In another example, the first port 603 can be configured to be coupled to a diplexer 612 (or one or more duplexers, one or more multiplexers, one or more circulators, or one or more splitters). The diplexer 612 can be configured to be coupled to a first UL amplification and filtering path 621, a first DL amplification and filtering path 639, and a second DL amplification and filtering path 672. A first-direction signal received at the first port 603 can be directed to the diplexer 612. The diplexer 612 can direct the first-direction signal, based on its frequency, to the first UL amplification and filtering path 621.

In another example, the second port 605 can be configured to be coupled to a diplexer 614 (or one or more duplexers, one or more multiplexers, one or more circulators, or one or more splitters). The diplexer 614 can be configured to be coupled to a duplexer 620. The duplexer 620 can be configured to be coupled to the first UL amplification and filtering path 629 and the first DL amplification and filtering path 631. The diplexer can be configured to be coupled to a second DL amplification and filtering path 672. A second-direction signal received at the second port 605 can be directed to the diplexer 614. The diplexer 614 can direct the second-direction signal, based on its frequency, to the duplexer 630. The duplexer 630 can be configured to be coupled to a first UL amplification and filtering path 629 and a first DL amplification and filtering path 631. The diplexer 614 can be configured to be coupled to a second DL amplification and filtering path 662.

In another example, a first-direction signal can be directed from the duplexer 620 to the first UL amplification and filtering path 621. The first UL amplification and filtering path 621 can comprise one or more of: one or more low noise amplifiers (LNAs) 622, one or more variable attenuators 624, one or more filters 626, one or more power detectors 627, or one or more power amplifiers (PAS) 628. The one or more PAs 628 can comprise: a variable gain amplifier, a fixed-gain power amplifier, or a gain block. The one or more filters 626 can be configured to pass both a 3GPP FDD frequency band 12 UL and a 3GPP FDD frequency band 71 UL.

In another example, after being directed along the first-direction path, a first-direction signal can be amplified and filtered in accordance with the type of amplifiers and filters including along the first UL amplification and filtering path 621. The first-direction signal can be further directed to the duplexer 630. The duplexer 630 can direct the amplified and/or filtered first-direction signal to the diplexer 614. The diplexer 614 can direct the amplified and/or filtered first-direction signal to the second port 605. The first-direction signal can be directed from the second port 605 to the second antenna 604. The first-direction signal can be an uplink signal or a downlink signal.

In another example, a second-direction signal can be directed from the duplexer 630 to the first DL amplification and filtering path 631. The first DL amplification and filtering path 631 can comprise one or more of: one or more low noise amplifiers (LNAs) 632, one or more variable attenuators 634, one or more filters 636, one or more power detectors 637, or one or more power amplifiers (PAS) 638. The one or more PAs 638 can comprise: a variable gain amplifier, a fixed-gain power amplifier, or a gain block. The one or more filters 636 can be configured to pass both a 3GPP LTE frequency band 12 DL.

In another example, after being directed along the first DL amplification and filtering path 631, a second-direction signal can be amplified and filtered in accordance with the type of amplifiers and filters including along the first DL amplification and filtering path 631. The second-direction signal can be further directed to the duplexer 620. The duplexer 620 can direct the amplified and/or filtered second-direction signal to the diplexer 612. The diplexer 612 can direct the amplified and/or filtered second-direction signal to the first port 603. The second-direction signal can be directed from the first port 603 to the first antenna 602. The second-direction signal can be a downlink signal or an uplink signal.

In another example, the diplexer 614 can be configured to be coupled to the second DL amplification and filtering path 662. A second-direction signal received at the second port 605 can be directed to the diplexer 614. The diplexer 614 can direct the second-direction signal, based on its frequency, to the second DL amplification and filtering path 662. The second DL amplification and filtering path 662 can be configured to be coupled between the diplexer 614 and the diplexer 612.

In another example, a second-direction signal can be directed from the diplexer 614 to the second DL amplification and filtering path 662. The second DL amplification and filtering path 662 can comprise one or more of: one or more low noise amplifiers (LNAs) 664, one or more variable attenuators 666, one or more filters 668, one or more power detectors 669, or one or more power amplifiers (PAS) 670. The one or more PAs 670 can comprise: a variable gain amplifier, a fixed-gain power amplifier, or a gain block. The one or more filters 668 can be configured to pass a 3GPP LTE frequency band 71 DL.

In another example, after being directed along the second DL amplification and filtering path 662, a second-direction signal can be amplified and filtered in accordance with the type of amplifiers and filters including along the second DL amplification and filtering path 662. The second-direction signal can be further directed to the diplexer 612. The diplexer 612 can direct the amplified and/or filtered second-direction signal to the first port 603. The second-direction signal can be directed from the first port 603 to the first antenna 602. The second-direction signal can be a downlink signal or an uplink signal.

In another example, the one or more power detectors 637 can be configured to detect a maximum power or a total power from a DL signal of a first band (e.g., 3GPP LTE frequency band 12 DL). In another example, the one or more power detectors 669 can be configured to detect a maximum power or a total power from a DL signal of a second band (e.g., 3GPP LTE frequency band 71 DL). In one example, the one or more power detectors can comprise one or more broadband power detectors or one or more channelized power detectors.

In another example, a controller 610 can be configured to select an allowed maximum noise power or amplified gain level of the UL signal of the first band (e.g., 3GPP LTE frequency band 12 UL) and the UL signal of the second band (e.g., 3GPP LTE frequency band 71 UL) based on the detected maximum power or total DL signal power level to provide network protection. By adjusting the gain or noise floor when performing the network protection, the controller 610 can prevent the network (e.g., base stations) from becoming overloaded with uplink signals from the repeater that exceed a defined threshold.

Figure 7A:
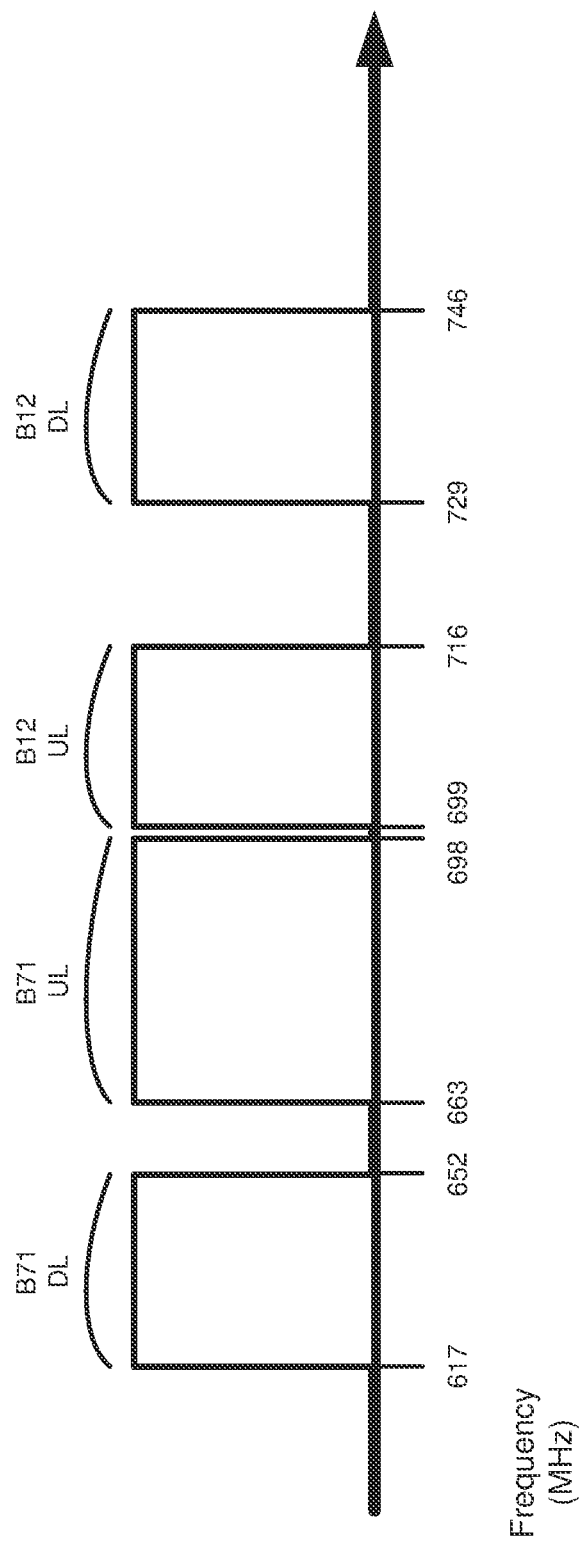
FIG. 7a illustrates Third Generation Partnership Project (3GPP) long term evolution (LTE) frequency bands in accordance with an example.

In another example, as illustrated in FIG. 7a, an uplink (UL) signal of a first band (e.g., B12 UL) can occupy a frequency range between approximately 699 megahertz (MHZ) and approximately 716 MHZ. An UL signal of a second band (e.g., B71 UL) can occupy a frequency range between approximately 663 MHZ and approximately 698 MHZ.

In another example, a downlink (DL) signal of a first band (e.g., B12 DL) can occupy a frequency range between approximately 729 MHz and approximately 746 MHz. A DL signal of a second band (e.g., B71 DL) can occupy a frequency range between approximately 617 MHz and approximately 652 MHz.

Figure 3C:
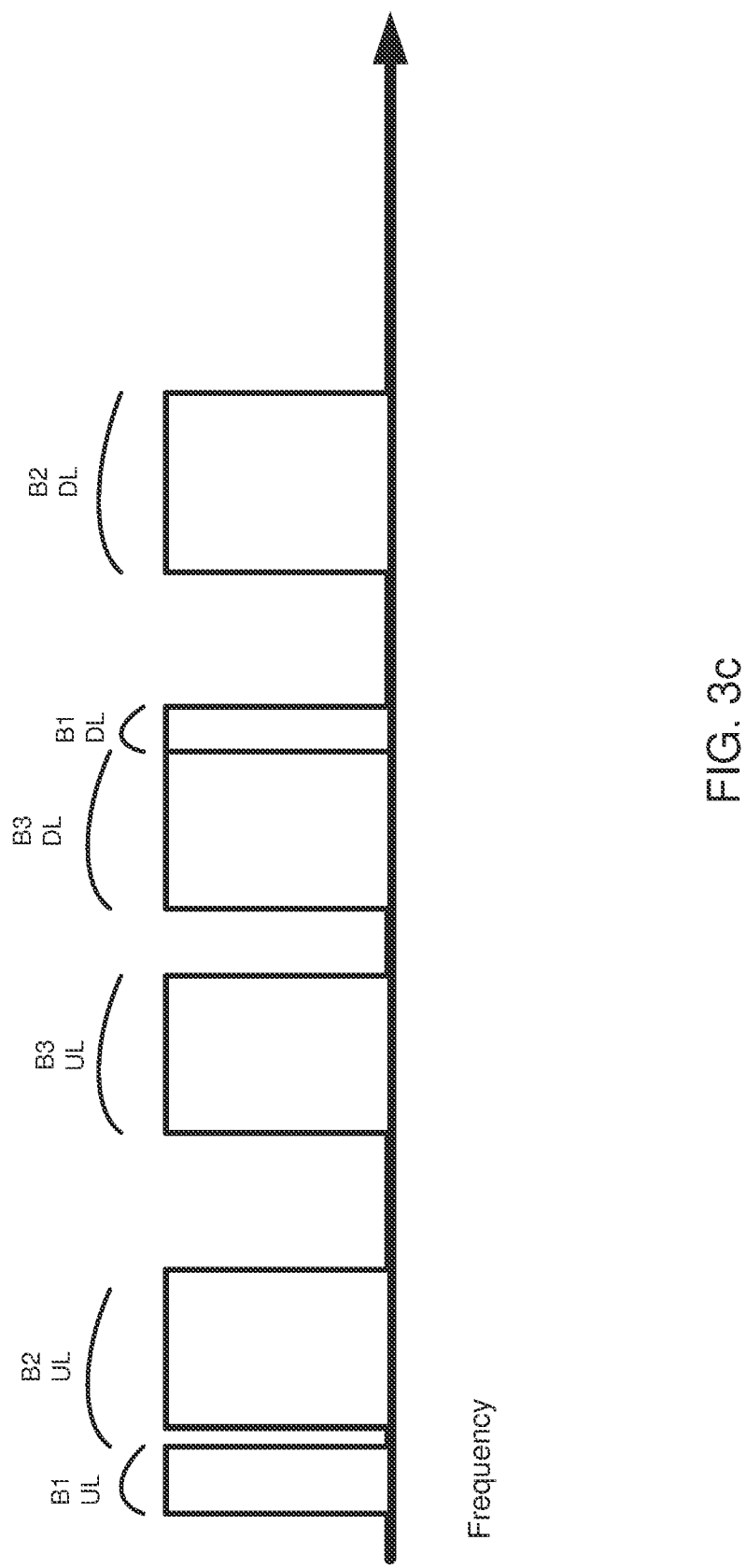
FIG. 3c illustrates frequency bands with a band gap in accordance with an example.

In another example, a bandwidth border for the UL signal of the first band (e.g., B12 UL) can be separated from a bandwidth border for the UL signal of the second band (e.g., B71 UL) by less than 5 MHz or by less than 10 MHZ, as shown in FIG. 3c. In another example, a bandwidth border for the UL signal of the first band (e.g., B12 UL) can be adjacent to a bandwidth border for the UL signal of the second band (e.g., B71 UL).

In another example, the first band can be 3GPP LTE band 12 and the second band can be 3GPP LTE band 71.

In another example, as illustrated in FIG. 7b, a multiplexer 700 can comprise a common port 710, a first separate port 722, a second separate port 724, and a third separate port 726. The common port 710 can comprise a first uplink (UL) filter configured to pass a UL signal of a first band (e.g., 3GPP LTE frequency band 12 UL) and a UL signal of a second band (e.g., 3GPP LTE frequency band 71 UL). The common port 710 can comprise a first downlink (DL) filter configured to pass a DL signal of the first band (e.g., 3GPP LTE frequency band 12 DL). The common port 710 can comprise a second DL filter configured to pass a DL signal of the second band (e.g., 3GPP LTE frequency band 71 DL).

In another example, the first separate port 722 can comprise a second UL filter configured to pass the UL signal of the first band (e.g., 3GPP LTE frequency band 12 UL) and the UL signal of the second band (e.g., 3GPP LTE frequency band 71 UL). The second separate port 724 can comprise a third DL filter configured to pass the DL signal of the first band (e.g., 3GPP LTE frequency band 12 DL). The third separate port 726 can comprise a fourth DL filter configured to pass a DL signal of the second band (e.g., 3GPP LTE frequency band 71 DL).

Figure 8:
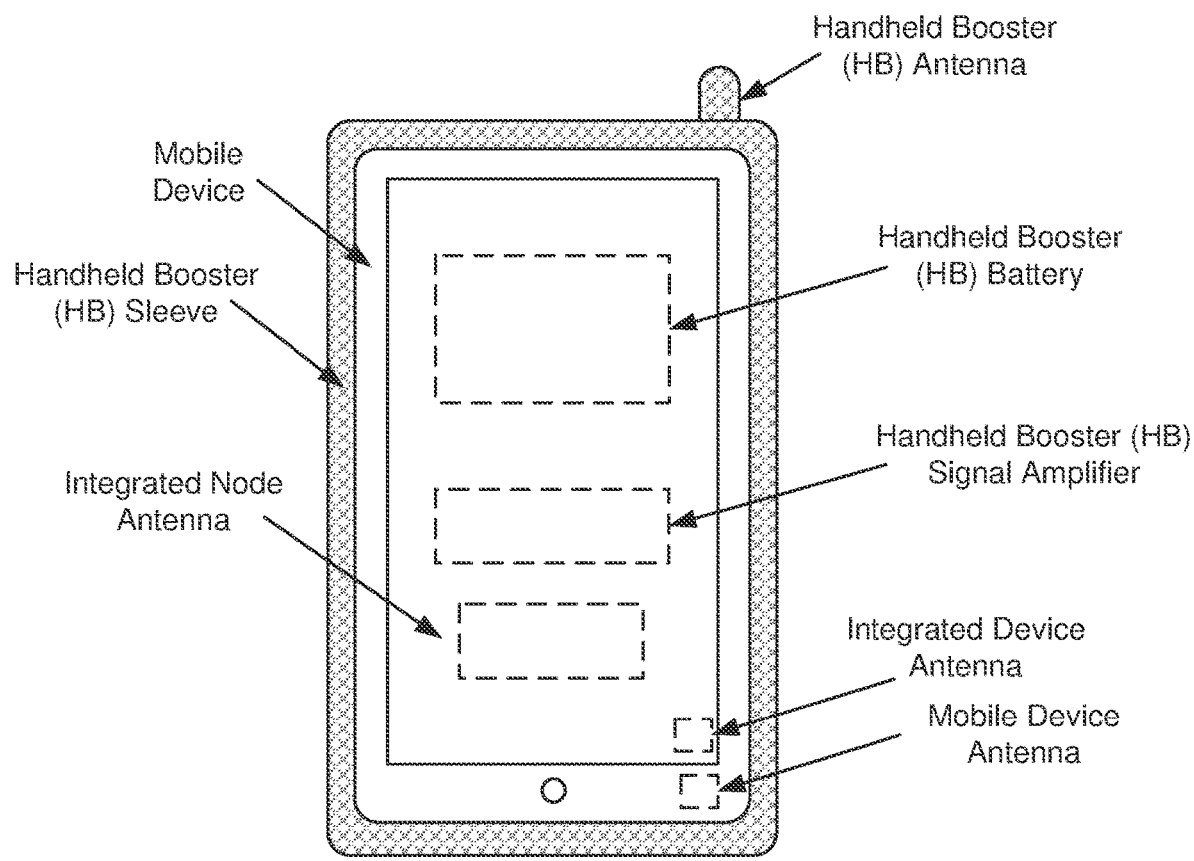
FIG. 8 illustrates a handheld booster in communication with a wireless device in accordance with an example.

While various embodiments described herein, and illustrated in FIGS. 1-7b, have been described with respect to a cellular signal amplifier with a donor antenna and a server antenna, this is not intended to be limiting. A repeater can also be accomplished using a handheld booster, as illustrated in FIG. 8. The handheld booster can include an integrated device antenna and an integrated node antenna that are typically used in place of the server antenna and the donor antenna, respectively.

Figure 9:
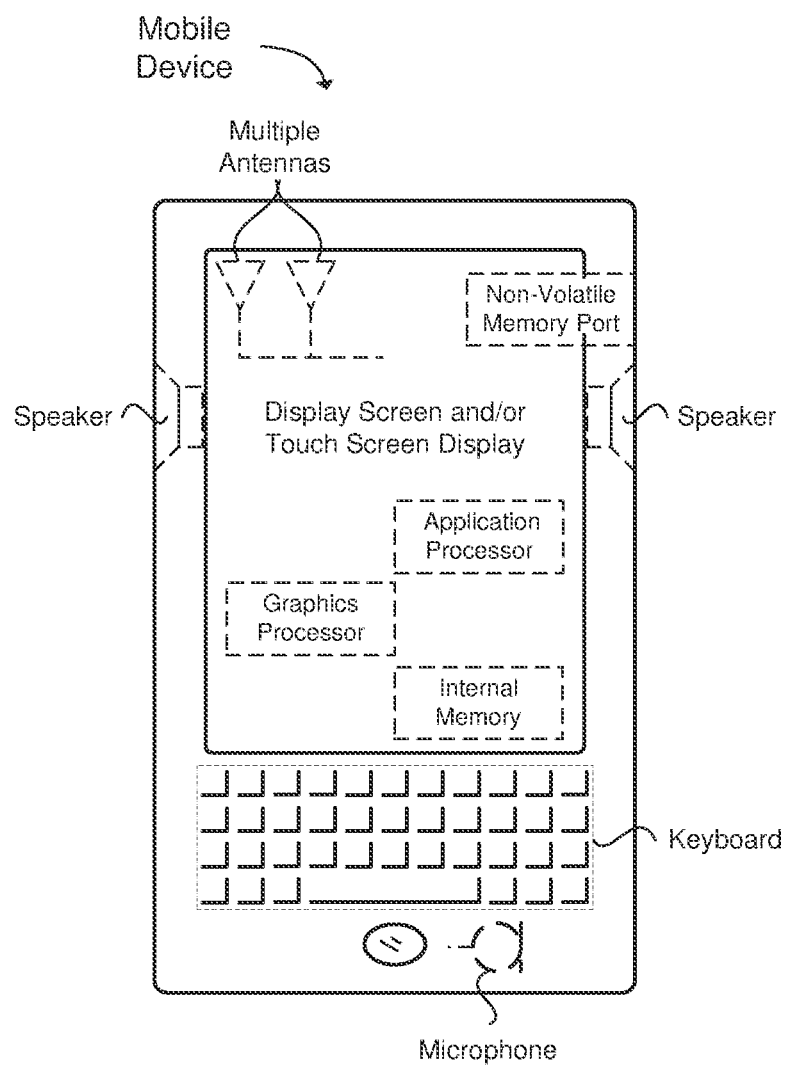
FIG. 9 illustrates a user equipment (UE) in accordance with an example.

FIG. 9 provides an example illustration of the wireless device, such as a user equipment (UE), a mobile station (MS), a mobile wireless device, a mobile communication device, a tablet, a handset, or other type of wireless device. The wireless device can include one or more antennas configured to communicate with a node, macro node, low power node (LPN), or, transmission station, such as a base station (BS), an evolved Node B (eNB), a baseband processing unit (BBU), a remote radio head (RRH), a remote radio equipment (RRE), a relay station (RS), a radio equipment (RE), or other type of wireless wide area network (WWAN) access point. The wireless device can be configured to communicate using at least one wireless communication standard such as, but not limited to, 3GPP LTE, WiMAX, High Speed Packet Access (HSPA), Bluetooth, and WiFi. The wireless device can communicate using separate antennas for each wireless communication standard or shared antennas for multiple wireless communication standards. The wireless device can communicate in a wireless local area network (WLAN), a wireless personal area network (WPAN), and/or a WWAN. The wireless device can also comprise a wireless modem. The wireless modem can comprise, for example, a wireless radio transceiver and baseband circuitry (e.g., a baseband processor). The wireless modem can, in one example, modulate signals that the wireless device transmits via the one or more antennas and demodulate signals that the wireless device receives via the one or more antennas.

FIG. 9 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be integrated with the wireless device or wirelessly connected to the wireless device to provide additional user input. A virtual keyboard can also be provided using the touch screen.

Figure 10:
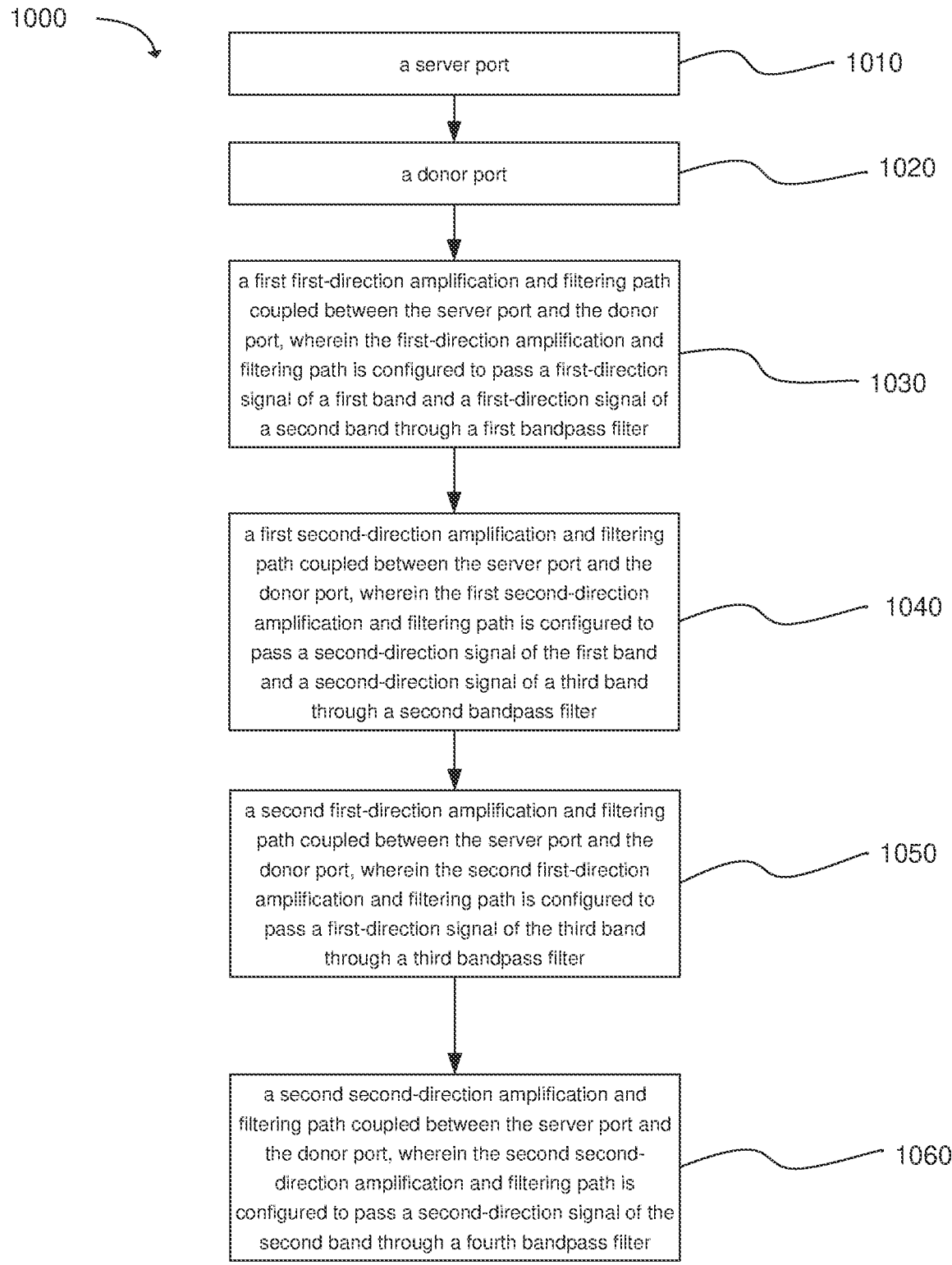
FIG. 10 depicts a repeater in accordance with an example.

Another example provides a repeater 1000, as shown in the flow chart in FIG. 10. The repeater can comprise: a server port, as shown in block 1010. The repeater can comprise: a donor port, as shown in block 1020. The repeater can comprise a first first-direction amplification and filtering path coupled between the server port and the donor port, wherein the first-direction amplification and filtering path is configured to pass a first-direction signal of a first band and a first-direction signal of a second band through a first bandpass filter, as shown in block 1030. The repeater can comprise a first second-direction amplification and filtering path coupled between the server port and the donor port, wherein the first second-direction amplification and filtering path is configured to pass a second-direction signal of the first band and a second-direction signal of a third band through a second bandpass filter, as shown in block 1040. The repeater can comprise a second first-direction amplification and filtering path coupled between the server port and the donor port, wherein the second first-direction amplification and filtering path is configured to pass a first-direction signal of the third band through a third bandpass filter, as shown in block 1050. The repeater can comprise a second second-direction amplification and filtering path coupled between the server port and the donor port, wherein the second second-direction amplification and filtering path is configured to pass a second-direction signal of the second band through a fourth bandpass filter, as shown in block 1060.

Figure 11:
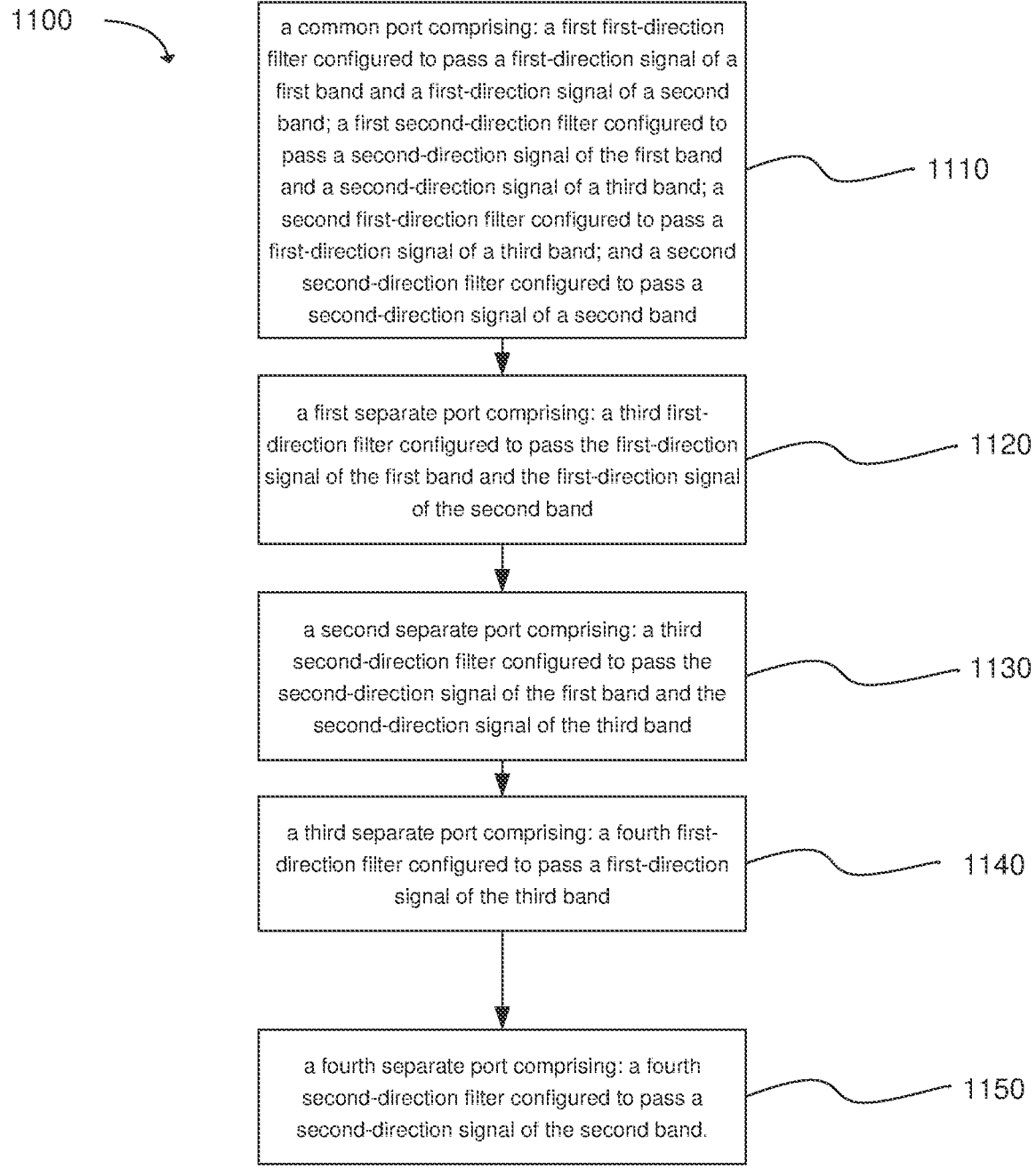
FIG. 11 depicts a multiplexer in accordance with an example.

Another example provides a multiplexer 1100, as shown in the flow chart in FIG. 11. The multiplexer can comprise a common port comprising: a first first-direction filter configured to pass a first-direction signal of a first band and a first-direction signal of a second band; a first second-direction filter configured to pass a second-direction signal of the first band and a second-direction signal of a third band; a second first-direction filter configured to pass a first-direction signal of a third band; and a second second-direction filter configured to pass a second-direction signal of a second band, as shown in block 1110. The multiplexer can comprise a first separate port comprising: a third first-direction filter configured to pass the first-direction signal of the first band and the first-direction signal of the second band, as shown in block 1120. The multiplexer can comprise a second separate port comprising: a third second-direction filter configured to pass the second-direction signal of the first band and the second-direction signal of the third band, as shown in block 1130. The multiplexer can comprise a third separate port comprising: a fourth first-direction filter configured to pass a first-direction signal of the third band, as shown in block 1140. The multiplexer can comprise a fourth second-direction filter configured to pass a second-direction signal of the second band, as shown in block 1150.

Figure 12:
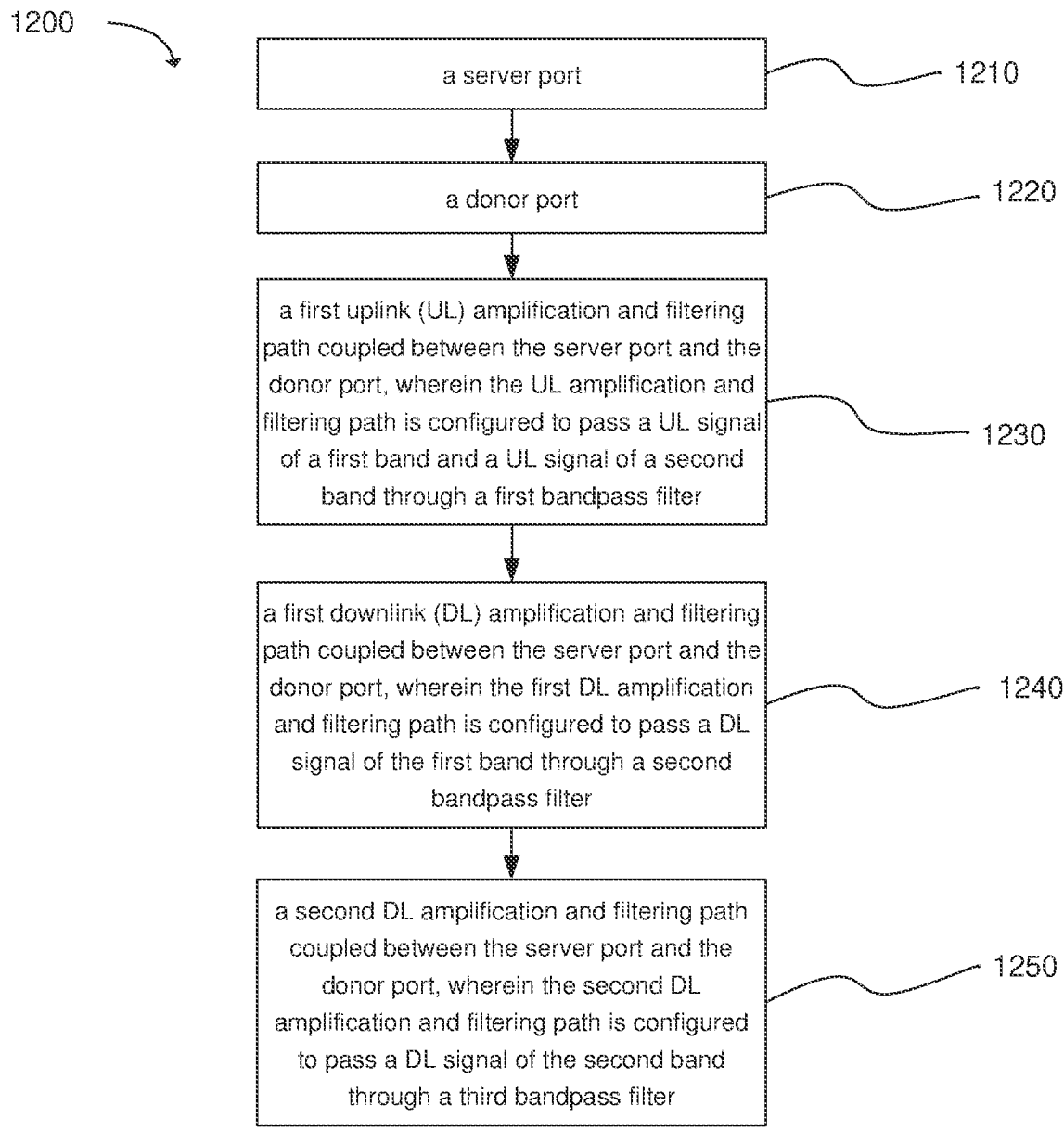
FIG. 12 depicts a repeater in accordance with an example.

Another example provides a repeater 1200, as shown in the flow chart in FIG. 12. The repeater can comprise: a server port, as shown in block 1210. The repeater can comprise: a donor port, as shown in block 1220. The repeater can comprise a first uplink (UL) amplification and filtering path coupled between the server port and the donor port, wherein the UL amplification and filtering path is configured to pass a UL signal of a first band and a UL signal of a second band through a first bandpass filter, as shown in block 1230. The repeater can comprise a first downlink (DL) amplification and filtering path coupled between the server port and the donor port, wherein the first DL amplification and filtering path is configured to pass a DL signal of the first band through a second bandpass filter, as shown in block 1240. The repeater can comprise a second DL amplification and filtering path coupled between the server port and the donor port, wherein the second DL amplification and filtering path is configured to pass a DL signal of the second band through a third bandpass filter, as shown in block 1250.

Figure 13:
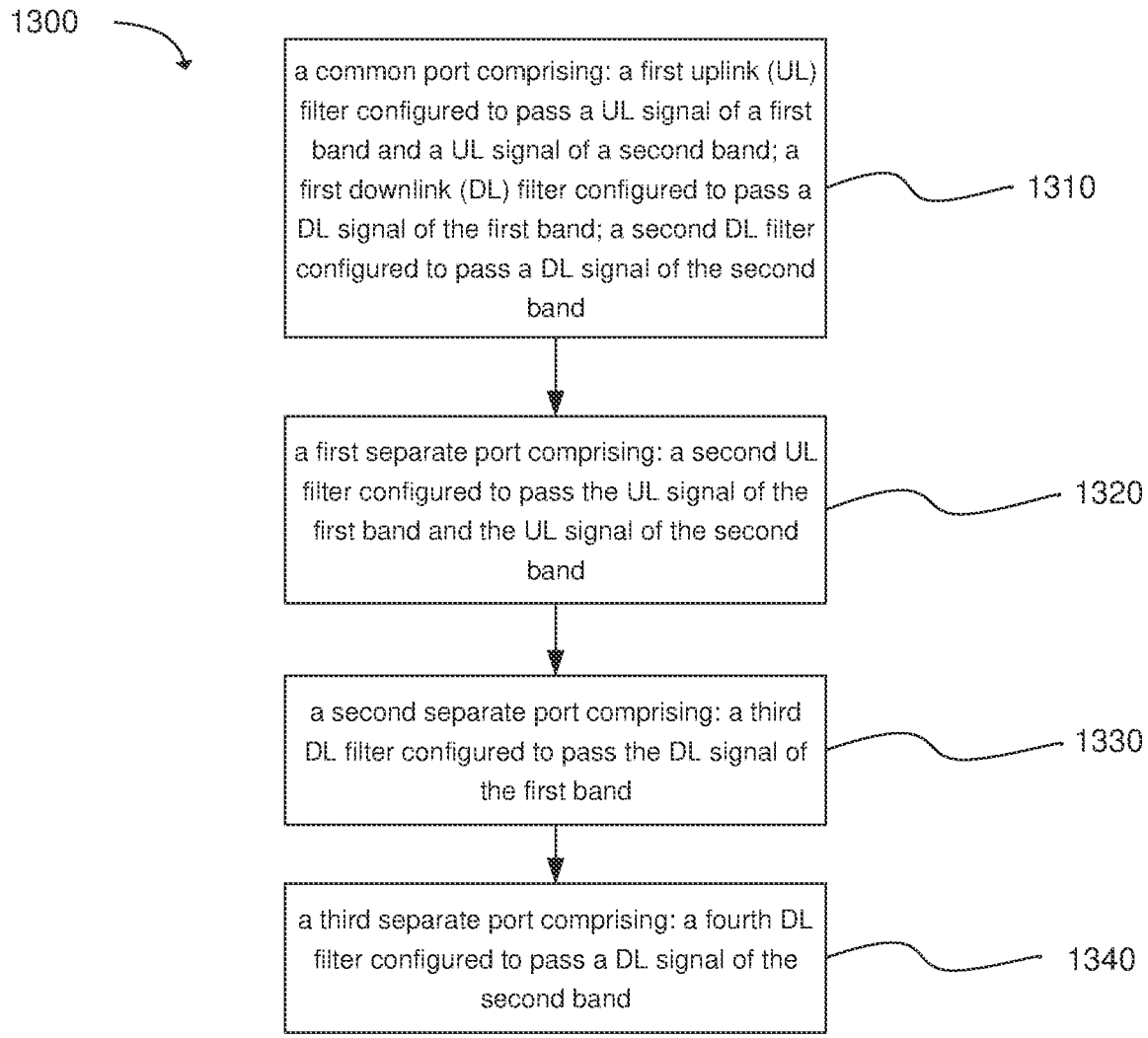
FIG. 13 depicts a repeater in accordance with an example.

Another example provides a multiplexer 1300, as shown in the flow chart in FIG. 13. The multiplexer can comprise a common port comprising a first uplink (UL) filter configured to pass a UL signal of a first band and a UL signal of a second band; a first downlink (DL) filter configured to pass a DL signal of the first band; and a second DL filter configured to pass a DL signal of the second band, as shown in block 1310. The multiplexer can comprise a first separate port comprising: a second UL filter configured to pass the UL signal of the first band and the UL signal of the second band, as shown in block 1320. The multiplexer can comprise a second separate port comprising: a third DL filter configured to pass the DL signal of the first band, as shown in block 1330. The multiplexer can comprise a third separate port comprising: a fourth DL filter configured to pass a DL signal of the second band, as shown in block 1340.

Examples

The following examples pertain to specific technology embodiments and point out specific features, elements, or actions that can be used or otherwise combined in achieving such embodiments.

Example 1 includes a repeater comprising: a server port; a donor port; a first first-direction amplification and filtering path coupled between the server port and the donor port, wherein the first-direction amplification and filtering path is configured to pass a first-direction signal of a first band and a first-direction signal of a second band through a first bandpass filter; a first second-direction amplification and filtering path coupled between the server port and the donor port, wherein the first second-direction amplification and filtering path is configured to pass a second-direction signal of the first band and a second-direction signal of a third band through a second bandpass filter; a second first-direction amplification and filtering path coupled between the server port and the donor port, wherein the second first-direction amplification and filtering path is configured to pass a first-direction signal of the third band through a third bandpass filter; and a second second-direction amplification and filtering path coupled between the server port and the donor port, wherein the second second-direction amplification and filtering path is configured to pass a second-direction signal of the second band through a fourth bandpass filter.

Example 2 includes the repeater of Example 1, wherein the first-direction is an uplink (UL) direction and the second-direction is a downlink (DL) direction.

Example 3 includes the repeater of Example 2, further comprising: one or more power detectors configured to: detect a maximum power level or a total power level from: the DL signal of the first band and the third band; the DL signal of the second band; and a controller configured to: provide network protection by selecting an allowed maximum noise power or amplified gain level of the UL signal of the first band and the UL signal of the second band based on the detected maximum or total DL signal power level.

Example 4 includes the repeater of Example 2, further comprising: one or more power detectors configured to detect a power level from the DL signal of the first band; and a controller configured to provide network protection by selecting a power level of the UL signal of the first band based on the power level from the DL signal of the first band.

Example 5 includes the repeater of Example 2, wherein: the UL signal of the second band comprises a first UL subset band that includes a first UL subset bandwidth less than a bandwidth of the UL signal of the second band; the DL signal of the second band comprises a first DL subset band that includes a first DL subset bandwidth less than a bandwidth of the DL signal of the second band; the UL signal of the third band comprises a second UL subset band that includes a second UL subset bandwidth less than a bandwidth of the UL signal of the third band; and the DL signal of the third band comprises a second DL subset band that includes a second DL subset bandwidth less than a bandwidth of the DL signal of the third band.

Example 6 includes the repeater of Example 2, wherein: a bandwidth border for the UL signal of the first band is separated from a bandwidth border for the UL signal of the second band by less than 10 megahertz (MHZ); or a bandwidth border for the DL signal of the first band is separated from a bandwidth border for the DL signal of the third band by less than 10 MHz.

Example 7 includes the repeater of any of Examples 1 to 6, wherein: the first band is Third Generation Partnership Project (3GPP) long term evolution (LTE) band 70, the second band is one or more of 3GPP LTE band 4 or 3GPP LTE band 66, and the third band is one or more of 3GPP LTE band 2 or 3GPP LTE band 25.

Example 8 includes the repeater of Example 1, further comprising: a third first-direction amplification and filtering path coupled between the server port and the donor port, wherein the third first-direction amplification and filtering path is configured to pass a first-direction signal of a fourth band through a fifth bandpass filter; and a third second-direction amplification and filtering path coupled between the server port and the donor port, wherein the third second-direction amplification and filtering path is configured to pass a second-direction signal of the fourth band through a sixth bandpass filter.

Example 9 includes the repeater of Example 8, wherein the fourth band is Third Generation Partnership Project (3GPP) long term evolution (LTE) band 30.

Example 10 includes a multiplexer comprising: a common port comprising: a first first-direction filter configured to pass a first-direction signal of a first band and a first-direction signal of a second band; a first second-direction filter configured to pass a second-direction signal of the first band and a second-direction signal of a third band; a second first-direction filter configured to pass a first-direction signal of a third band; and a second second-direction filter configured to pass a second-direction signal of a second band; a first separate port comprising: a third first-direction filter configured to pass the first-direction signal of the first band and the first-direction signal of the second band; a second separate port comprising: a third second-direction filter configured to pass the second-direction signal of the first band and the second-direction signal of the third band; a third separate port comprising: a fourth first-direction filter configured to pass a first-direction signal of the third band; and a fourth separate port comprising: a fourth second-direction filter configured to pass a second-direction signal of the second band.

Example 11 includes the multiplexer of Example 10, wherein: the first-direction signal of the second band comprises a first first-direction subset band that includes a first first-direction subset bandwidth less than a bandwidth of the first-direction signal of the second band; the second-direction signal of the second band comprises a first second-direction subset band that includes a first second-direction subset bandwidth less than a bandwidth of the second-direction signal of the second band; the first-direction signal of the third band comprises a second first-direction subset band that includes a second first-direction subset bandwidth less than a bandwidth of the first-direction signal of the third band; and the second-direction signal of the third band comprises a second second-direction subset band that includes a second second-direction subset bandwidth less than a bandwidth of the second-direction signal of the third band.

Example 12 includes the multiplexer of Example 10, wherein: a bandwidth border for the first-direction signal of the first band is separated from a bandwidth border for the first-direction signal of the second band by less than 10 megahertz (MHz); or a bandwidth border for the second-direction signal of the first band is separated from a bandwidth border for the second-direction signal of the third band by less than 10 MHz.

Example 13 includes the multiplexer of any of Examples 10 to 12, wherein: the first band is Third Generation Partnership Project (3GPP) long term evolution (LTE) band 70, the second band is one or more of 3GPP LTE band 4 or 3GPP LTE band 66, and the third band is one or more of 3GPP LTE band 2 or 3GPP LTE band 25.

Example 14 includes the multiplexer of Example 10, further comprising: the common port further comprising: a fifth first-direction filter configured to pass a first-direction signal of a fourth band; and a fifth second-direction filter configured to pass a second-direction signal of the fourth band; a fifth separate port comprising: a sixth first-direction filter configured to pass the first-direction signal of the fourth band; and a sixth separate port comprising: a sixth second-direction filter configured to pass the second-direction signal of the fourth band.

Example 15 includes the multiplexer of Example 14, wherein the fourth band is Third Generation Partnership Project (3GPP) long term evolution (LTE) band 30.

Example 16 includes the repeater of Example 10, wherein the first-direction is an uplink (UL) direction and the second-direction is a downlink (DL) direction.

Example 17 includes a repeater comprising: a server port; a donor port; a first uplink (UL) amplification and filtering path coupled between the server port and the donor port, wherein the UL amplification and filtering path is configured to pass a UL signal of a first band and a UL signal of a second band through a first bandpass filter; a first downlink (DL) amplification and filtering path coupled between the server port and the donor port, wherein the first DL amplification and filtering path is configured to pass a DL signal of the first band through a second bandpass filter; and a second DL amplification and filtering path coupled between the server port and the donor port, wherein the second DL amplification and filtering path is configured to pass a DL signal of the second band through a third bandpass filter.

Example 18 includes the repeater of Example 17, further comprising: one or more power detectors configured to: detect a maximum or total power level from: the DL signal of the first band; and the DL signal of the second band; and a controller configured to: provide network protection by selecting an allowed maximum noise power or amplified gain level of the UL signal of the first band and second band based on the detected maximum or total DL signal power level.

Example 19 includes the repeater of Example 17, wherein: a bandwidth border for the UL signal of the first band is separated from a bandwidth border for the UL signal of the second band by less than 10 megahertz (MHz).

Example 20 includes the repeater of Example 17, wherein: the first band is Third Generation Partnership Project (3GPP) long term evolution (LTE) band 12, and the second band is 3GPP LTE band 71.

Example 21 includes a multiplexer comprising: a common port comprising: a first uplink (UL) filter configured to pass a UL signal of a first band and a UL signal of a second band; a first downlink (DL) filter configured to pass a DL signal of the first band; and a second DL filter configured to pass a DL signal of the second band; a first separate port comprising: a second UL filter configured to pass the UL signal of the first band and the UL signal of the second band; a second separate port comprising: a third DL filter configured to pass the DL signal of the first band; and a third separate port comprising: a fourth DL filter configured to pass a DL signal of the second band.

Example 22 includes the multiplexer of Example 21, wherein: a bandwidth border for the UL signal of the first band is separated from a bandwidth border for the UL signal of the second band by less than 10 megahertz (MHZ).

Example 23 includes the multiplexer of any of Examples 21 to 22, wherein: the first band is Third Generation Partnership Project (3GPP) long term evolution (LTE) band 12, and the second band is 3GPP LTE band 71.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The low energy fixed location node, wireless device, and location server can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be not separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A repeater comprising:

a server port;

a donor port;

a first first-direction amplification and filtering path coupled between the server port and the donor port, wherein the first-direction amplification and filtering path is configured to pass a first-direction signal of a first band and a first-direction signal of a second band through a first bandpass filter;

a first second-direction amplification and filtering path coupled between the server port and the donor port, wherein the first second-direction amplification and filtering path is configured to pass a second-direction signal of the first band and a second-direction signal of a third band through a second bandpass filter;

a second first-direction amplification and filtering path coupled between the server port and the donor port, wherein the second first-direction amplification and filtering path is configured to pass a first-direction signal of the third band through a third bandpass filter; and a second second-direction amplification and filtering path coupled between the server port and the donor port, wherein the second second-direction amplification and filtering path is configured to pass a second-direction signal of the second band through a fourth bandpass filter;

wherein:

the first-direction signal of the second band comprises a first first-direction subset band that includes a first first-direction subset bandwidth less than a bandwidth of the first-direction signal of the second band;

the second-direction signal of the second band comprises a first second-direction subset band that includes a first second-direction subset bandwidth less than a bandwidth of the second-direction signal of the second band;

the first-direction signal of the third band comprises a second first-direction subset band that includes a second first-direction subset bandwidth less than a bandwidth of the first-direction signal of the third band; and the second-direction signal of the third band comprises a second second-direction subset band that includes a second second-direction subset bandwidth less than a bandwidth of the second-direction signal of the third band.

2. The repeater of claim 1, wherein the first-direction signal is an uplink (UL) direction and the second-direction signal is a downlink (DL) direction.

3. The repeater of claim 2, further comprising:
one or more power detectors configured to:
  detect a maximum power level or a total power level from:
    the DL signal of the first band and the third band;
    the DL signal of the second band; and
a controller configured to:
  provide network protection by selecting an allowed maximum noise power or amplified gain level of the UL signal of the first band and the UL signal of the second band based on the detected maximum or total DL signal power level.

4. The repeater of claim 2, further comprising:
one or more power detectors configured to detect a power level from the DL signal of the first band; and
a controller configured to provide network protection by selecting a power level of the UL signal of the first band based on the power level from the DL signal of the first band.

5. The repeater of claim 2, wherein:
a bandwidth border for the UL signal of the first band is separated from a bandwidth border for the UL signal of the second band by less than 10 megahertz (MHz); or
a bandwidth border for the DL signal of the first band is separated from a bandwidth border for the DL signal of the third band by less than 10 MHz.

6. The repeater of claim 1, wherein:
the first band is Third Generation Partnership Project (3GPP) long term evolution (LTE) band 70,
the second band is one or more of 3GPP LTE band 4 or 3GPP LTE band 66, and
the third band is one or more of 3GPP LTE band 2 or 3GPP LTE band 25.

7. The repeater of claim 1, further comprising:
a third first-direction amplification and filtering path coupled between the server port and the donor port, wherein the third first-direction amplification and filtering path is configured to pass a first-direction signal of a fourth band through a fifth bandpass filter; and
a third second-direction amplification and filtering path coupled between the server port and the donor port, wherein the third second-direction amplification and filtering path is configured to pass a second-direction signal of the fourth band through a sixth bandpass filter.

8. The repeater of claim 7, wherein the fourth band is Third Generation Partnership Project (3GPP) long term evolution (LTE) band 30.

9. A multiplexer comprising:
a common port comprising:
  a first first-direction filter configured to pass a first-direction signal of a first band and a first-direction signal of a second band;
  a first second-direction filter configured to pass a second-direction signal of the first band and a second-direction signal of a third band;
  a second first-direction filter configured to pass a first-direction signal of a third band; and
  a second second-direction filter configured to pass a second-direction signal of a second band;
a first separate port comprising:
  a third first-direction filter configured to pass the first-direction signal of the first band and the first-direction signal of the second band;
a second separate port comprising:
  a third second-direction filter configured to pass the second-direction signal of the first band and the second-direction signal of the third band;
a third separate port comprising:
  a fourth first-direction filter configured to pass a first-direction signal of the third band; and
a fourth separate port comprising:
  a fourth second-direction filter configured to pass a second-direction signal of the second band.

10. The multiplexer of claim 9, wherein:
the first-direction signal of the second band comprises a first first-direction subset band that includes a first first-direction subset bandwidth less than a bandwidth of the first-direction signal of the second band;
the second-direction signal of the second band comprises a first second-direction subset band that includes a first second-direction subset bandwidth less than a bandwidth of the second-direction signal of the second band;
the first-direction signal of the third band comprises a second first-direction subset band that includes a second first-direction subset bandwidth less than a bandwidth of the first-direction signal of the third band; and
the second-direction signal of the third band comprises a second second-direction subset band that includes a second second-direction subset bandwidth less than a bandwidth of the second-direction signal of the third band.

11. The multiplexer of claim 9, wherein:
a bandwidth border for the first-direction signal of the first band is separated from a bandwidth border for the first-direction signal of the second band by less than 10 megahertz (MHz); or
a bandwidth border for the second-direction signal of the first band is separated from a bandwidth border for the second-direction signal of the third band by less than 10 MHz.

12. The multiplexer of claim 9, wherein:
the first band is Third Generation Partnership Project (3GPP) long term evolution (LTE) band 70,
the second band is one or more of 3GPP LTE band 4 or 3GPP LTE band 66, and
the third band is one or more of 3GPP LTE band 2 or 3GPP LTE band 25.

13. The multiplexer of claim 9, further comprising:
the common port further comprising:
  a fifth first-direction filter configured to pass a first-direction signal of a fourth band; and
  a fifth second-direction filter configured to pass a second-direction signal of the fourth band;
a fifth separate port comprising:
  a sixth first-direction filter configured to pass the first-direction signal of the fourth band; and
a sixth separate port comprising:
  a sixth second-direction filter configured to pass the second-direction signal of the fourth band.

14. The multiplexer of claim 13, wherein the fourth band is Third Generation Partnership Project (3GPP) long term evolution (LTE) band 30.

15. The repeater of claim 9, wherein the first-direction signal is an uplink (UL) direction and the second-direction signal is a downlink (DL) direction.

16. A repeater comprising:
a server port;
a donor port;
a first uplink (UL) amplification and filtering path coupled between the server port and the donor port, wherein the UL amplification and filtering path is configured to pass a UL signal of a first band and a UL signal of a second band through a first bandpass filter;

a first downlink (DL) amplification and filtering path coupled between the server port and the donor port, wherein the first DL amplification and filtering path is configured to pass a DL signal of the first band through a second bandpass filter; and a second DL amplification and filtering path coupled between the server port and the donor port, wherein the second DL amplification and filtering path is configured to pass a DL signal of the second band through a third bandpass filter;

wherein:

the UL signal of the second band comprises a first UL subset band that includes a first UL subset bandwidth less than a bandwidth of the UL signal of the second band;

the DL signal of the second band comprises a first DL subset band that includes a first DL subset bandwidth less than a bandwidth of the DL signal of the second band;

the UL signal of the third band comprises a second UL subset band that includes a second UL subset bandwidth less than a bandwidth of the UL signal of the third band; and the DL signal of the third band comprises a second DL subset band that includes a second DL subset bandwidth less than a bandwidth of the DL signal of the third band.

17. The repeater of claim 16, further comprising:
one or more power detectors configured to:
  detect a maximum or total power level from:
    the DL signal of the first band; and
    the DL signal of the second band; and
a controller configured to:
  provide network protection by selecting an allowed maximum noise power or amplified gain level of the UL signal of the first band and second band based on the detected maximum or total DL signal power level.

18. The repeater of claim 16, wherein:
a bandwidth border for the UL signal of the first band is separated from a bandwidth border for the UL signal of the second band by less than 10 megahertz (MHz).

19. The repeater of claim 16, wherein:
the first band is Third Generation Partnership Project (3GPP) long term evolution (LTE) band 12, and
the second band is 3GPP LTE band 71.

20. A repeater comprising:
a server port;
a donor port;
a first first-direction amplification and filtering path coupled between the server port and the donor port, wherein the first-direction amplification and filtering path is configured to pass a first-direction signal of a first band and a first-direction signal of a second band through a first bandpass filter;
a first second-direction amplification and filtering path coupled between the server port and the donor port, wherein the first second-direction amplification and filtering path is configured to pass a second-direction signal of the first band and a second-direction signal of a third band through a second bandpass filter;
a second first-direction amplification and filtering path coupled between the server port and the donor port, wherein the second first-direction amplification and filtering path is configured to pass a first-direction signal of the third band through a third bandpass filter;
a second second-direction amplification and filtering path coupled between the server port and the donor port, wherein the second second-direction amplification and filtering path is configured to pass a second-direction signal of the second band through a fourth bandpass filter;
a third first-direction amplification and filtering path coupled between the server port and the donor port, wherein the third first-direction amplification and filtering path is configured to pass a first-direction signal of a fourth band through a fifth bandpass filter; and
a third second-direction amplification and filtering path coupled between the server port and the donor port, wherein the third second-direction amplification and filtering path is configured to pass a second-direction signal of the fourth band through a sixth bandpass filter.

21. The repeater of claim 20, wherein the fourth band is Third Generation Partnership Project (3GPP) long term evolution (LTE) band 30.

* * * * *